United States Patent [19]
Wada et al.

[11] Patent Number: 5,661,345
[45] Date of Patent: Aug. 26, 1997

[54] SEMICONDUCTOR DEVICE HAVING A SINGLE-CRYSTAL METAL WIRING

[75] Inventors: Junichi Wada; Hisashi Kaneko; Kyoichi Suguro; Nobuo Hayasaka, all of Kanagawa-ken; Haruo Okano, Tokyo, all of Japan

[73] Assignee: Kabushiki Kaisha Toshiba, Kawasaki, Japan

[21] Appl. No.: 353,214

[22] Filed: Dec. 1, 1994

Related U.S. Application Data

[62] Division of Ser. No. 35,208, Mar. 22, 1993, Pat. No. 5,409,862.

[30] Foreign Application Priority Data

| | | | |
|---|---|---|---|
| Mar. 24, 1992 | [JP] | Japan | 4-065781 |
| Jun. 29, 1992 | [JP] | Japan | 4-192733 |
| Jul. 17, 1992 | [JP] | Japan | 4-212380 |
| Sep. 14, 1992 | [JP] | Japan | 4-269202 |
| Mar. 4, 1993 | [JP] | Japan | 5-067410 |

[51] Int. Cl.[6] .................................................. H01L 23/48
[52] U.S. Cl. .......................... 257/767; 257/771; 257/773
[58] Field of Search ............................... 257/767, 752, 257/771, 754, 773

[56] References Cited

U.S. PATENT DOCUMENTS

| | | | |
|---|---|---|---|
| 4,352,239 | 10/1982 | Pierce | 257/767 |
| 4,847,673 | 7/1989 | Matsukawa | 257/767 |
| 5,001,541 | 3/1991 | Virkus et al. | 257/767 |
| 5,406,123 | 4/1995 | Narayan | 257/767 |
| 5,428,251 | 6/1995 | Naito et al. | 257/767 |

FOREIGN PATENT DOCUMENTS

| 407133 | 1/1990 | European Pat. Off. | 257/765 |
|---|---|---|---|

*Primary Examiner*—William Mintel
*Assistant Examiner*—Roy Potter
*Attorney, Agent, or Firm*—Oblon, Spivak, McClelland, Maier & Neustadt, P.C.

[57] ABSTRACT

The method of producing a semiconductor device includes the steps of forming a groove having a predetermined pattern shape on the surface of a substrate; forming a metal film on the substrate while reaction with the surface of the substrate is suppressed; and agglomerating the metal film by in-situ annealing, wherein agglomeration of the metal film is started before the metal film reacts with the surface of the substrate due to annealing, while formation of a native oxide on the metal film is suppressed, and whereby the metal film is filled into the groove by annealing at a predetermined temperature for a predetermined period of time. The structure of the semiconductor device includes an insulator in which there is formed a groove portion having a predetermined pattern shape and an electrode interconnection made of a single-crystal metal which is filled in the groove portion.

3 Claims, 40 Drawing Sheets

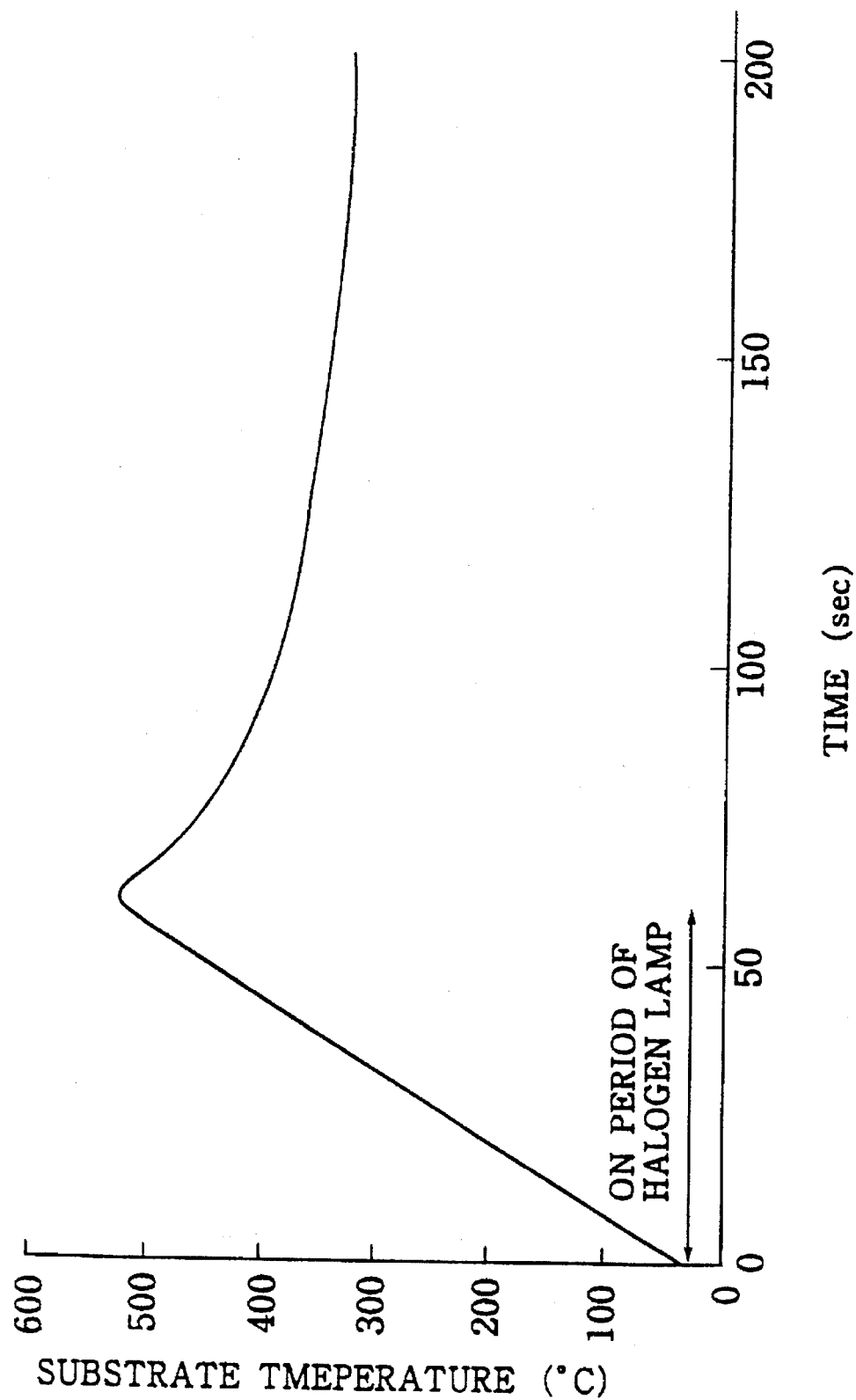

$R = 3.18 \times 10^{17} \exp{-(2.562/kT)}$
k : BOLTZMANN'S CONSTANT

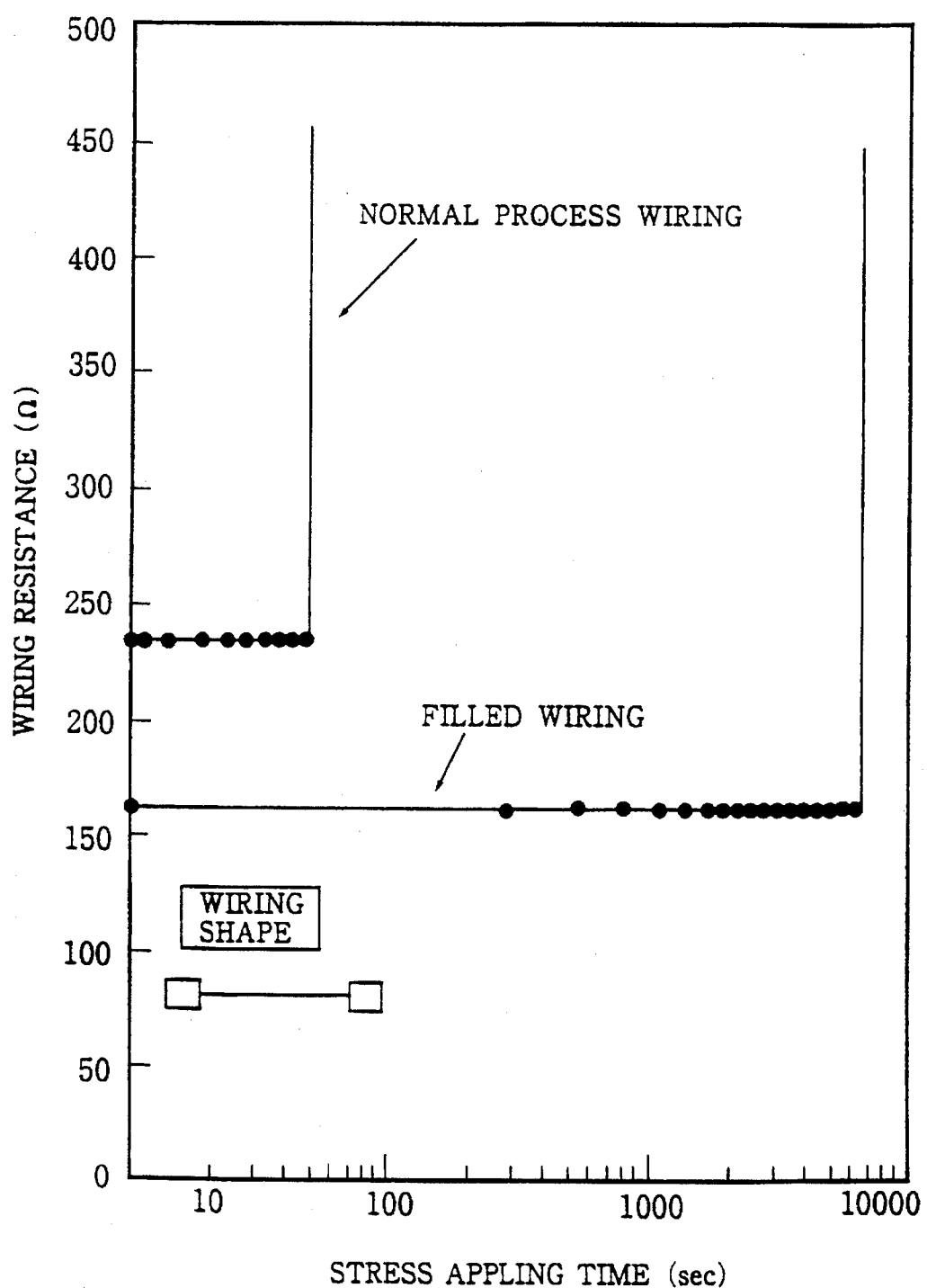

GROOVE
MATERIAL B
MATERIAL A

GROOVE
MATERIAL B
MATERIAL A

WC    EM

DISCONNECT

| CRYSTAL-LINE FACE | 100 | 110 | 111 | 210 | 211 | 221 | 310 |
|---|---|---|---|---|---|---|---|
| 100 | 0<br>90 | | | | | | |
| 110 | 45<br>90 | 0<br>60<br>90 | | | | | |
| 111 | 54.7 | 35.3<br>90 | 0<br>70.5<br>109.5 | | | | |
| 210 | 26.6<br>63.4<br>90 | 18.4<br>50.8<br>71.6 | 39.2<br>75.0 | 0<br>36.9<br>53.1 | | | |
| 211 | 35.3<br>65.9 | 30<br>54.7<br>73.2<br>90 | 19.5<br>61.9<br>90 | 24.1<br>43.1<br>56.8 | 0<br>33.6<br>48.2 | | |
| 221 | 48.2<br>70.5 | 19.5<br>45<br>76.4<br>90 | 15.8<br>54.7<br>78.9 | 26.6<br>41.8<br>53.4 | 17.7<br>35.3<br>47.1 | 0<br>27.3<br>39.0 | |

FIG.41

| CRYSTAL-LINE FACE | 100 | 110 | 111 | 210 | 211 | 221 | 310 |
|---|---|---|---|---|---|---|---|
| 310 | 18.4 | 26.6 | 43.1 | 8.1 | 25.4 | 32.5 | 0 |
|  | 71.6 | 47.9 | 68.6 | 58.1 | 49.8 | 42.5 | 25.9 |
|  | 90 | 63.4 |  | 45 | 58.9 | 58.2 | 36.9 |
|  |  | 77.1 |  |  |  |  |  |
| 311 | 25.2 | 31.5 | 29.5 | 19.3 | 10.0 | 25.2 | 17.6 |
|  | 72.5 | 64.8 | 58.5 | 47.6 | 42.4 | 45.3 | 40.3 |
|  |  | 90 | 80 | 66.1 | 60.5 | 59.8 | 55.1 |
| 320 | 33.7 | 11.3 | 36.9 | 7.1 | 25.2 | 22.4 | 15.3 |
|  | 56.3 | 54.0 | 80.8 | 29.8 | 37.6 | 42.3 | 37.9 |
|  | 90 | 66.9 |  | 41.9 | 55.6 | 49.7 | 52.1 |
| 321 | 36.7 | 19.1 | 22.2 | 17.0 | 10.9 | 11.5 | 21.6 |
|  | 57.7 | 40.9 | 51.9 | 33.2 | 29.2 | 27.0 | 32.3 |
|  | 74.5 | 55.5 | 72.0 | 53.3 | 40.2 | 36.7 | 40.5 |
|  |  |  | 90 |  |  |  |  |
| 331 | 46.5 | 13.1 | 22.0 |  |  |  |  |
| 510 | 11.4 |  |  |  |  |  |  |
| 511 | 15.6 |  |  |  |  |  |  |
| 711 | 11.3 |  |  |  |  |  |  |

SEMICONDUCTOR DEVICE HAVING A SINGLE-CRYSTAL METAL WIRING

This is a division of application Ser. No. 08/035,208 filed Mar. 22, 1993, now U.S. Pat. No. 5,409,862.

BACKGROUND OF THE INVENTION

1. Field of the Invention

The present invention relates to a method for producing a semiconductor device and a structure for a semiconductor device, and it particularly relates to the method in which an electrode wiring with an improved planar process for the semiconductor device is achieved so that migration endurance is superior and there is caused no corrosion. The present invention further relates to an electrode wire structure in which wire reliability is improved, a wire resistance and contact resistance is reduced, a heat radiation effect for wiring is improved, a stress for the semiconductor device is relaxed, and a wiring adhesion is improved.

2. Description of the Prior Art

In the conventional practice, aluminum (Al) alloy in which Al is a major component is used as an electrode wire material for an LSI (Large-Scale Integration) circuit so as to form a wiring metal by etching a continuous film. However, a wire width and a thickness of wire film are minified due to an ever fine structure of the LSI circuit, so that there is caused a problem where a wire reliability therefor is inferior.

As causes for a low interconnection reliability, there can be considered an electromigration phenomenon and a stressmigration phenomenon. Hereinafter, terms wiring (wire) and interconnection are used interchangeably. Taking an example of Al here, the electromigration is an phenomenon where an electron flowing the interconnection collides with an Al atom so that the Al atom is transferred. The stress migration is a phenomenon in which the transfer of Al atom is caused by a mechanical stress of other material used for LSI. These phenomena have been known accordingly by a recent study.

In order to solve a problem of the low interconnection reliability, that a crystal orientation of Al interconnection is controlled has been examined. An Al crystal has a face centered cubic structure and an surface energy thereof is minimum in a (111) face. Therefore, when an Al film is formed by a sputtering method or the like, a <111> direction is normal to the substrate such that the surface energy is minimum.

When the preferred <111> direction oriented normal to the substrate is further improved, the probability that a (111) face having a minimum surface energy faces with the (111) face at a wire cross section is decreased, so that a slit-like disconnection due to the stressmigration is decreased and the interconnection reliability can be improved.

However, though the <111> preferred orientation is indicated when the Al is formed by the convention sputtering method, a fine crystal grain at an early stage of film formation reaches immediately with a neighboring fine crystal grain. The Al which became a continuous film accordingly is affected each other between neighboring crystal grains, so that the preferred <111> direction oriented normal to the substrate is deteriorated. In other words, there is problem in the conventional practice where the preferred <111> direction is deteriorated due to interaction between crystal grains under the conventional formation method.

Moreover, the further preferred orientation of <111> in Al can not completely control an in-plane orientation of crystal grain in a surface, so that the grown Al film becomes polycrystalline oriented in the preferred <111> direction oriented normal to the substrate. When a semiconductor device is formed by such Al film in a manner described above, there exist a great deal of crystal grain boundaries in a wiring region. The crystal grain boundaries in the wiring region is considered as a set of lattice defect, so that a structure thereof is unstable and a diffusion coefficient for the Al atom in the grain boundary is rather big.

Therefore, the electromigration occurs in a manner that a transfer of Al atom up to the grain boundary occurs in a same rate and the rate the transfer of Al atom is increased at the grain boundary. In other words, there occurs a depletion of atom in an upstream side where the Al atom flows apart from the crystal boundary, and there occurs an accumulation of atom in a downstream side. The depletion of atom may cause a disconnection of interconnection, and the accumulation of atom may cause hillocks.

Moreover, when a mechanical stress is applied to the Al interconnection, the atom thereof tends to move in a direction where the stress is relieved. Then, the transfer of Al atom is likely to occur for the grain boundary in the interconnection, so that the atom of the grain boundary is depleted and the interconnection is disconnected. Among such grain boundaries, when the neighboring crystal grains are crystal grains with a micro inclination rotation, diffusion of the Al atoms in the grain boundaries are slow so as to have a certain tolerance against the respective migrations mentioned before.

However, an improvement of the preferred <111> orientation is not considered and the in-plane orientation control is not performed in the (111) face of the crystal grains in case of forming the Al film in the conventional production process of the semiconductor devices. Thus, though the formed Al film indicates the preferred <111> orientation normal to the substrate, the orientation is not sufficient and each crystal grain rotates randomly in the (111) face. Therefore, there is a problem where the interconnection is likely to be disconnected due to the fact that the conventional Al interconnection lacks endurance against the electromigration as well as the stressmigration.

A resistance value of the interconnection relates to a R—C (resistance-capacitance) delay and is an important factor which determines an operational speed of the semiconductor device, so that a low resistance is required. As miniaturization of the device becomes significant, the low resistance is also required in terms of a self-heating problem in the interconnection. However, there is a limit in a material in terms of the low resistance in the conventional Al alloy interconnection, so that a change to a new wiring material is necessary.

As for material such as Cu and Ag that have a lower resistance than Al-containing material, it is hard to form a compound having a high vapor pressure. Thus there is a problem where a process is rather difficult to be performed by a dry etching such as the conventional reactive ion etching (RIE). Moreover, there is a problem where corrosion is likely to occur due to an effect by a residual etching gas even for Al in which the process is relatively easy.

Moreover, the conventional interconnection formed using the RIE method is of a projection type. Therefore, there is needed a planar process for an interlayer insulator which is later formed, thus causing to increase the number of processes and creating a problem where a sufficient planar degree cannot be obtained.

On the other hand, in the conventional polycrystalline Al multilayer interconnection structure, it is likely that a mechanical stress remains behind at the time of forming the interlayer insulator. As a consequence, such structure is weak against the stressmigration and the interconnection is likely to be disconnected.

Moreover, in the conventional multilayer wiring structure, an upper wiring metal is formed after a contact hole is opened, so as to connect an upper wire and a lower wire. When Al is formed by a usual sputtering method, there are problems where a characteristic of step coverage is inferior, a bench-cut occurs, and a contact resistance is increased.

In order to alleviate such problems, a different metal such as W is filled as a plug into the contact hole in the conventional practice, so as to prevent a bench-cut defect. However, when used as the plug is the different metal from the upper and/or lower interconnections, an interconnection metal atom transferred due to the electromigration and stressmigration phenomena is hindered from the transfer thereof on account of the plug. When W is used, for instance, as the plug, W presents an excellent endurance against the electromigration and stressmigration compared to Al.

Therefore, in a cathode side of the W plug, the Al atoms transferred through the interconnection are accumulated and the hillock is formed, while, in an anode side of the plug, the Al atoms are depleted and the void is formed.

Moreover, even when the plug is formed by the same metals, there exist a native oxide film and a grain boundary between the plug and the upper layer interconnection, thus causing problems where migration endurance is deteriorated and the contact resistance is increased.

Moreover, as a result of miniaturization of interconnection, there flows a high-density current through the interconnection, thus causing problems where a wiring resistance is increased and the operational speed of the device is slowed down due to a self-heating of the interconnection.

Moreover, the conventional wiring patterns are of the structure where the mechanical stress is likely to occur to a substrate, thus causing defect due to the stress.

Accordingly, an electrode interconnection which is formed by the conventional method is inferior in the electromigration and stressmigration endurance, so that reliability for interconnection is low.

Moreover, the processing is difficult to be performed for the low-resistance wiring metal. Besides, there is a problem where the corrosion occurs due to the remaining etching gas even for the easy-to-process metal such as Al.

Moreover, there are problems where the number of processing is increased in order to achieve planarization and a degree of planarization is not desirable in the conventional interconnection.

Moreover, there are problems where, in the conventional multilayer interconnection, crystallinity deteriorates due to the mechanical stress generated in the course of forming the interlayer insulator on the interconnection, so that the reliability for interconnection deteriorates and the contact resistance between the upper layer and lower layer interconnections, between the upper layer interconnection and the plug, or between the plug and the lower layer interconnection. Moreover, there is a problem of the self-heating of the interconnection.

Moreover, there is a problem of poor migration endurance against between the metal plug differing from the interconnection metal and upper-and-lower layer interconnections.

SUMMARY OF THE INVENTION

In view of the foregoing problems, an object of the present invention is to provide an electrode interconnection by which a preferred orientation normal to the substrate is further improved, and an in-plane rotation of crystal grains in substrate face is suppressed so as to have an excellent endurance against stressmigration and electromigration. Another object thereof is to provide a semiconductor device where a wiring pattern for low-resistance metal for which etching is difficult is made possible without going through a wiring processing such as the etching, a corrosion is prevented from occurring, and an excellent planarization is achieved without going through a planar process. Still another object thereof is to provide an electrode wiring structure by which there remains no mechanical stress, a contact resistance is reduced, and a heat radiating effect is improved.

In one aspect of the present invention, there is provided a method for making single-crystal aluminum interconnection, the method comprises the steps of forming a groove having a predetermined pattern shape on the surface of a substrate; forming a metal film on the substrate while reaction with the surface of the substrate is suppressed; and agglomerating the metal film by in-situ annealing, wherein agglomeration of the metal film is started before the metal film reacts with the surface of the substrate due to annealing, while formation of a native oxide on the metal film is suppressed, and whereby the metal film is filled into the groove by annealing at a predetermined temperature for a predetermined period of time.

According to another aspect of the present invention, there is provided a method of producing a semiconductor device comprising the steps of: forming a groove having a predetermined pattern shape on the surface of a substrate; forming a metal film on the substrate; selectively removing the metal film formed in an area other than the groove; removing a native oxide film formed on the metal film; and agglomerating the metal film by annealing in an vacuum atmosphere so as to fill in the metal film into the groove while re-formation of the native oxide film is suppressed.

According to still another aspect of the present invention, there is provided a method of producing a semiconductor device comprising the steps of: forming a groove having a predetermined pattern shape on the surface of a substrate; forming a first metal thin film on the substrate; agglomerating the first metal film by annealing so as to fill the first metal into at least a portion of the groove while formation of a native oxide film thereon is suppressed; forming a second metal thin film made of a same material as the first metal thin film, on the substrate with agglomerated first thin film; and patterning the first and second thin films.

According to still another aspect of the present invention, there is provided a semiconductor device comprising: an insulator in which there is formed a groove portion having a predetermined pattern shape; and an electrode interconnection made of a single-crystal metal which is filled in the groove portion.

Other features and advantages of the present invention will become apparent from the following description taken in conjunction with the accompanying drawings.

BRIEF DESCRIPTION OF THE DRAWINGS

FIG. 2 shows an example of temperature change with respect to time, according to the first embodiment.

FIG. 8 shows an evaluation result concerning reliability of the Al wiring having a width of 1.2 μm in the first embodiment.

FIG. 26B and FIG. 26D show a pad portion where a groove portion is divided into plural parts, whereas

FIG. 40 and FIG. 41 show a table showing angles made between the crystal surfaces of the cubic crystals.

DETAILED DESCRIPTION OF THE PREFERRED EMBODIMENTS

Features of the present invention will become apparent in the course of the following description of exemplary embodiments which are given for illustration of the invention and are not intended to be limiting thereof. Embodiments of the present invention will now be described with reference to the drawings.

Embodiment No. 1

Figure 1A:
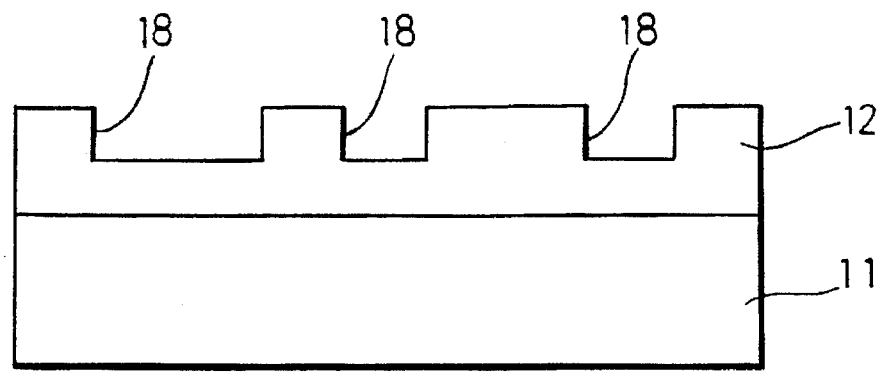
FIG. 1A, FIG. 1B and FIG. 1C shows cross sectional views for making a semiconductor device according to the first embodiment of the present invention.
Figure 1B:
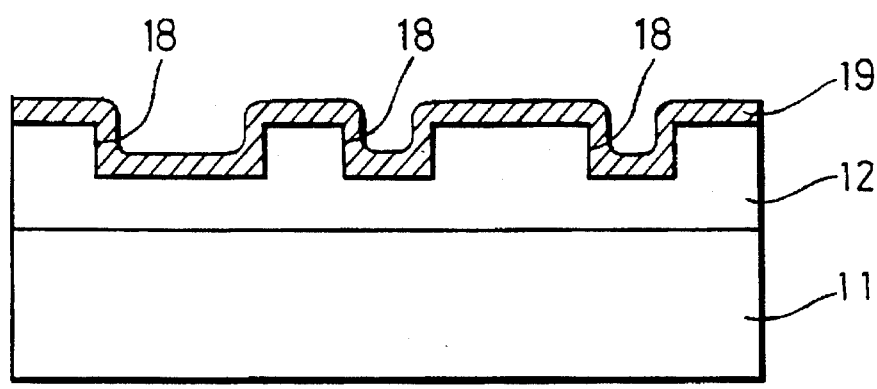
Figure 1C:
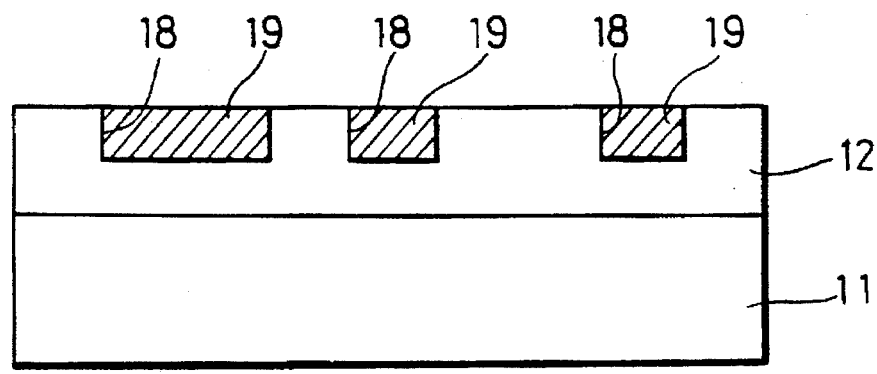

With reference to FIG. 1A, FIG. 1B and FIG. 1C, there are shown cross sectional views for making a semiconductor device according to the first embodiment of the present invention.

A (100) Si single crystal 11 is used as a substrate. With reference to FIG. 1A, a thermal oxide film 12 whose thickness is approximately 1 μm is formed on the Si substrate 11, and on the thermal oxide film 12 there is formed a wiring pattern groove whose depth and width are approximately 0.02 μm through 0.5 μm and 0.5 μm through 2 μm, respectively, by a photo-lithography and a reactive ion etching (RIE). By the RIE, an internal surface of a groove 18 is formed with good wettability. Having good wettability means that material is formed onto a layer or a groove in such a manner that a contact angle between, say, an upper material and a lower material disposed underneath the upper material is relatively low.

Gases utilized in the RIE are mixture of $CF_4$ and $H_2$ which flow at a rate of 18 SCCM (standard cc per minute) and 24 SCCM, respectively. A pressure at the time of etching is controlled to 40 mTorr and an applied power at the time of etching is 800 W. Thereafter, a resist is removed in an atmosphere of oxygen plasma. Thereafter, cleansing is carried out in mixture liquid of sulfuric acid and hydrogen peroxide water.

Next, with reference to FIG. 1B, an Al thin film 19 is formed on the thermal oxide film 12 by a d.c. magnetron sputtering method without annealing thereon. Then, Al with purity 99.9999% is used for a sputtering target, and the Al thickness is made equivalent to depth of the groove such that Al is formed to the thickness of 0.02 μm–0.5 μm. Ar is a gas that is utilized in the sputtering, a background pressure is less than $10^{-7}$ Torr, a pressure under sputtering is $3 \times 10^{-3}$ Torr, and an applied power is 6 KW, so as to form film suppressing the formation of the native oxide film.

Next, the above device is annealed using a halogen lamp heater from a back side of the substrate under the same vacuum background as in the sputtering for duration of one minute, as shown in FIG. 1C. In other words, the device is in-situ annealed so that Al is filled in the groove as a result of agglomeration in the groove. An arriving temperature for this annealing process was carried out in a range of 300° C. through 660° C. Thereafter, Al which remained behind in a wide-range region where a wiring pattern was not formed was removed using a resist etchback method.

FIG. 2 shows an example of temperature change with respect to time, according to the first embodiment. In this temperature profile, it is confirmed that the Al thin film was filled in the groove as a result of agglomeration. It shall be appreciated that an arriving time within which the agglomeration does not occur further in the groove may be kept as such though in the experience carried out by the applicants this time the device is cooled in a natural manner after a temperature rise.

Figure 3:
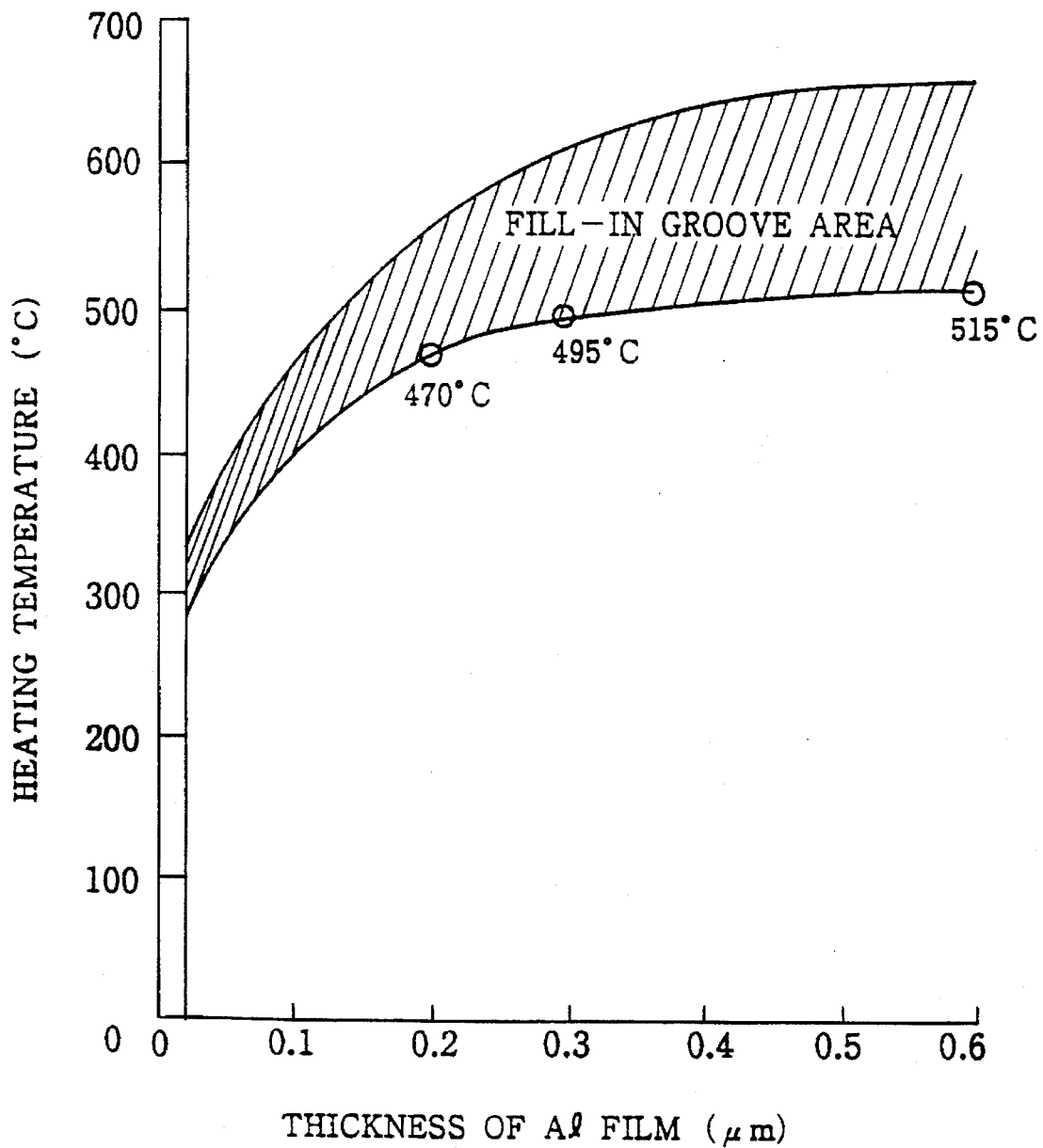
FIG. 3 shows a relationship between thickness of Al film and a temperature at which an Al filling in the groove is possible.

FIG. 3 shows relationship between thickness of Al film and a temperature at which an Al filling in the groove is possible. In the same figure, in case where the thickness of Al is 0.2 μm, filling into groove starts at a temperature of approximately 470° C. during an annealing process and the Al filled in the groove becomes separated at a temperature greater than 550° C. Therefore, according to FIG. 3, it is confirmed that Al interconnection will not be disconnected in a temperature range of 470° C. through 550° C. In a similar manner, it is confirmed that Al interconnection will not be disconnected in case where the thickness of Al is 0.3 μm at 495° C.–810° C. and in case where the thickness of Al is 0.6 μm at 515° C.–660° C.

Researching a temperature at which filling is possible for each film thickness, Al is filled in the groove in a hatched region shown in FIG. 3 and separation will not occur in the groove, namely, it was confirmed that interconnection would not be disconnected.

Figure 4:
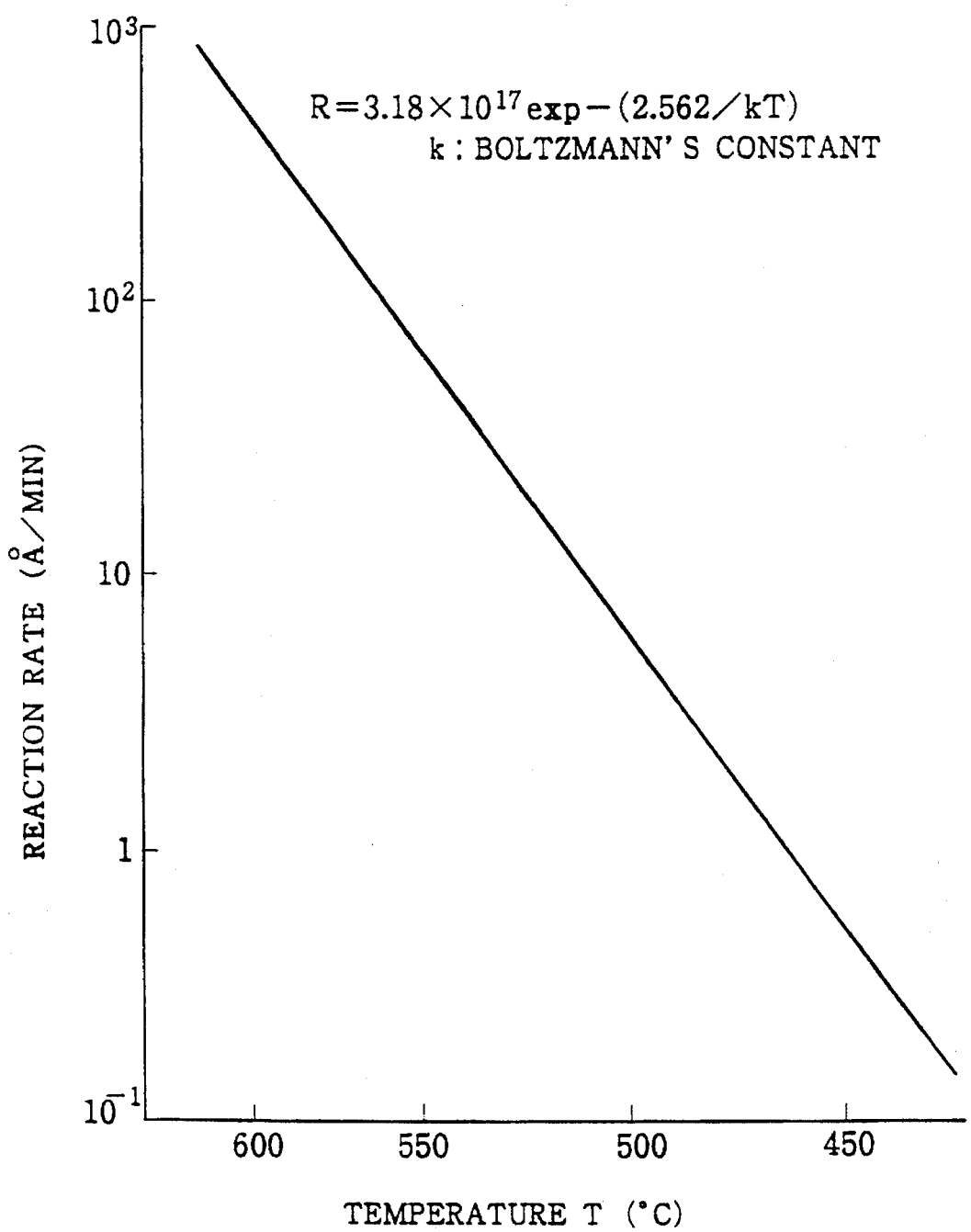
FIG. 4 shows a relationship between a production rate of a reaction product by an oxide film and Al, and temperature thereof, in terms of logarithmic graph.

FIG. 4 shows relationship between a production rate of a reaction product by an oxide film as a substrate and Al, and temperature thereof, in terms of logarithmic graph. A graph represented by FIG. 4 is calculated using $R = 3.18 \times 10^{17}$ exp $-(2.562/kT)$ and shows relationship between the reaction rate and the temperature. Here, k represents Boltzmann's constant. Here, R represents a reaction rate to indicate how much reaction product in a unit of angstrom is produced in a minute.

As seen from FIG. 4, thickness for the reaction product is determined by the temperature and time, so that when a temperature-rise rate is low the reaction product is formed between the substrate and Al. When the reaction product is formed between the substrate and Al, a transfer of Al atom in an interface between the substrate and Al is significantly hindered. Therefore, in order to assure that Al is filled into the groove, the agglomeration must be completed while the reaction product is not formed in the interface between the substrate and Al.

Thus, it is necessary to obtain, from time and temperature, the temperature-rise rate at which agglomeration temperature is reached as shown in FIG. 3. When the temperature-rise rate is high, agglomeration starts during which almost no reaction product is produced. Moreover, while the temperature is low, it is known that the reaction product is not produced.

Figure 5:
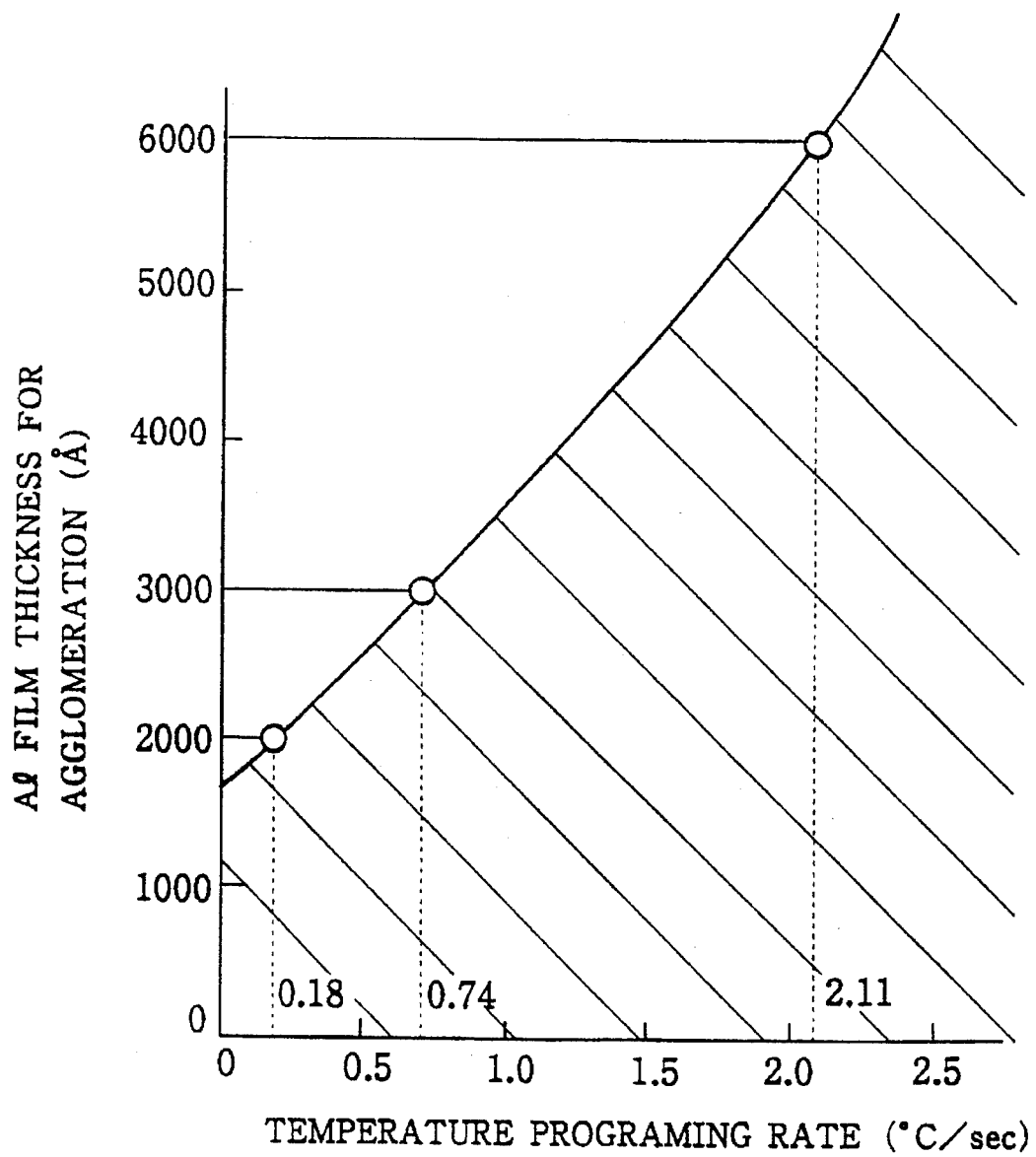
FIG. 5 shows a relationship between an Al film thickness and the temperature-rise rate.

From above facts, in FIG. 5 there is shown a relationship between an Al film thickness and the temperature-rise rate. A reason why there is provided a film thickness in a vertical axis in FIG. 5 is that a temperature at which the agglomeration is started differs with a film thickness as shown in FIG. 3. FIG. 5 was prepared based on a standard where the reaction product is made for an atomic layer, since when the reaction product is formed for one atomic layer, there would be the same for two or three atomic layers.

As seen from FIG. 5, when the film thickness is for example 2000 Angstrom, 3000 Angstrom and 6000 Angstrom, the temperature-rise rates need be greater than 0.18° C./sec, 0.74° C./sec and 2.11° C./sec, respectively.

Deriving the temperature-rise rate in each Al film thickness, it is known that if the temperature is increased up to an agglomeration starting temperature at a rate which is shown in a slanting-line provided region in FIG. 5, the reaction product in an interface between a thermal oxide film and an Al thin film is sufficiently thin, so that such reaction product does not prevent the thin film from agglomeration.

Figure 6A:
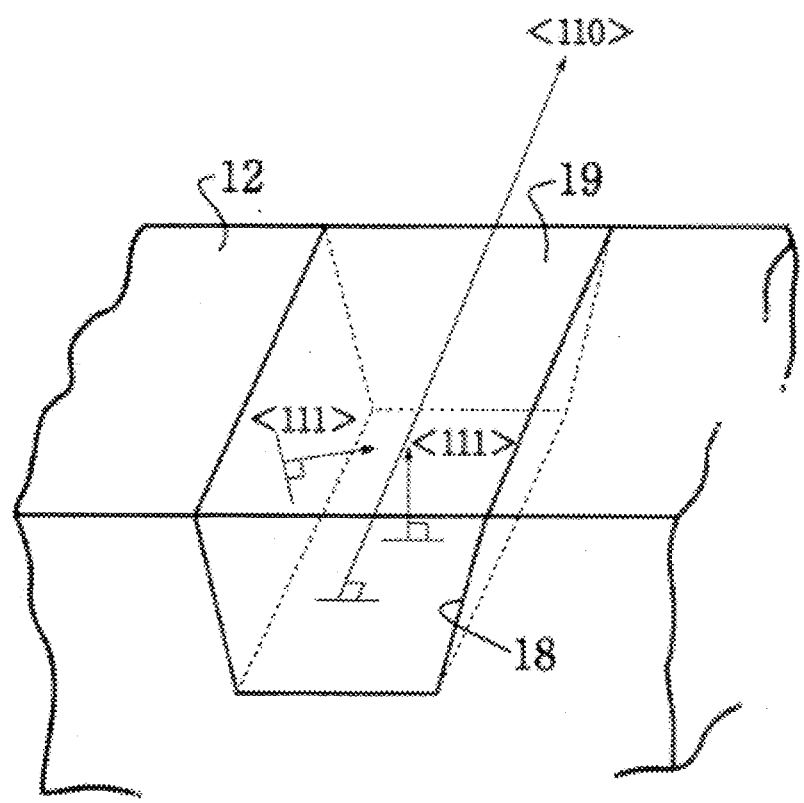
FIG. 6A shows a crystal orientation of filled Al.

FIG. 6A shows a crystal orientation of filled Al. The crystal orientation shown in FIG. 6A was obtained using an electron diffraction method. In the same figure, there is formed a (111) face having a minimum surface energy from a bottom face and side face of a groove 18, so that it was confirmed that most of a filled interconnection 19 formed in the groove 18 is a single crystal the same orientation. Then, an angle of a groove bottom face with respect to a groove side face was 75 degrees. It shall be appreciated that the angle of the bottom face with respect to the side face may be in the rage of 70°32'±20°.

Figure 6B:
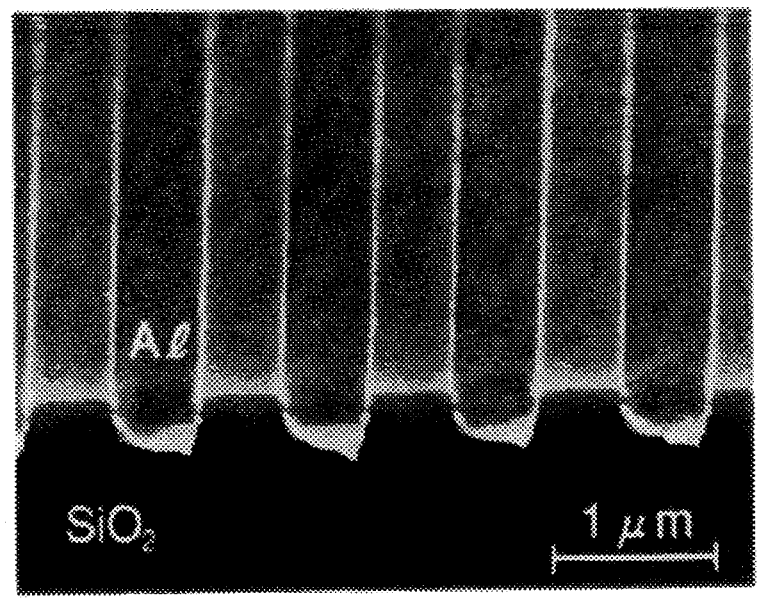
FIG. 6B is a SEM (scanning electron microscopy) image of the filled Al interconnection in the groove 18.

FIG. 6B is a SEM (scanning electron microscopy) image of the Al interconnection filled in the groove 18.

Figure 7A:
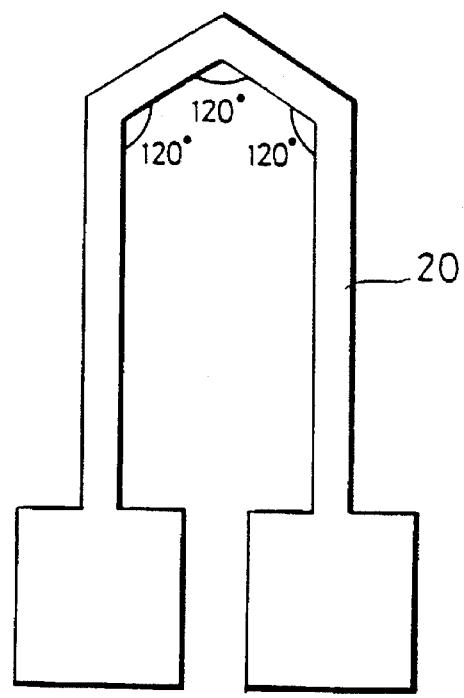
FIG. 7A shows that a bent portion of wiring 20 is bent in an angle of 120 degrees.
Figure 7B:
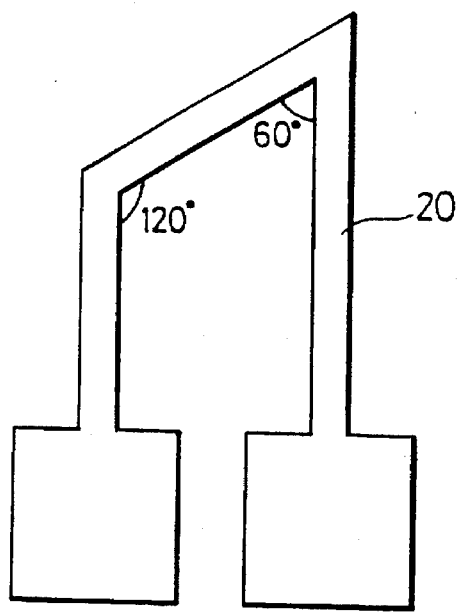
FIG. 7B shows that a bent portion of wiring 20 is bent in an angle of 60 and 120 degrees.

In case of indicating the crystal orientation, with reference to FIG. 7A and FIG. 7B, when a bending portion of wiring 20 is bent in 120' or 80', it was confirmed that a crystal grain boundary would not occur in the bending portion. This fact was also confirmed with other embodiments than this first embodiment.

FIG. 8 shows an evaluation result concerning reliability of the Al wiring having a width of 1.2 μm, a length of 1350 μm, and a thickness of 0.4 μm in the first embodiment. The evaluation was made under acceleration condition where a current density is $1.5 \times 10^7$ A/cm$^2$ and a temperature for the substrate is 200° C. Then, the conventional wiring was disconnected after approximately 60 seconds, while in the first embodiment the filled wiring was not disconnected until 9000 seconds.

In case where the wiring is such that an average grain size is 2–3 µm as in the conventional practice, the current density at which 10 FIT (a known failure indication rate having the units of $10^{-9}$ failures per hour) is guaranteed at 100° C. cannot go beyond $10^6$ A/cm$^2$. In contrast, in the wiring made in the embodiment, 10 FIT can be guaranteed in the current density exceeding $10^6$ A/cm$^2$.

In above first embodiment, explanation has been made where a groove-shaped wiring pattern is formed on a thermal oxide film surface. However, insulator such as BPSG film, PSG film, SiO$_2$ film, SiN film, BN film and polyimide film or the like may be used.

Moreover, though in the first embodiment there is used a resist etchback method for removing the wiring metal remained behind in a wide region where there is no wiring pattern, other removing methods such as chemical polishing, mechanical polishing, chemical mechanical polishing or lift-off method where C or TiN is used for an underlayer of the wiring metal can be used. For example, C and TiN may be removed by oxygen etching and H$_2$O$_2$ solution, respectively. Alternatively, the remaining (residual) metal can be filled into a separated dummy groove so as not to cause an interconnection short-circuiting.

Figure 9A:
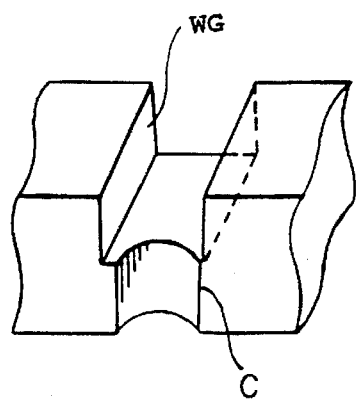
FIG. 9A shows a groove having a contact or via hole.
Figure 9B:
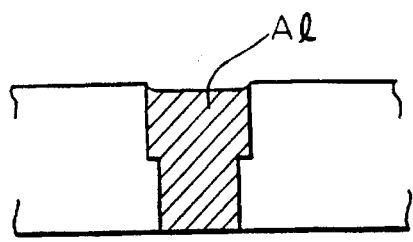
FIG. 9B shows a cross section of FIG. 9A where Al is filled into the contact or via hole by in-situ annealing.

With reference to FIGS. 9A and 9B, Al can be filled into a wiring groove WG having a contact hole or a via hole by agglomeration in a manner described in the first embodiment. Moreover, the Al can be filled into the contact or via hole alone. The Al which was thus filled in the contact or via hole was found to have no crystal grain boundary using a TEM (transmission electron microscopy) evaluation.

Moreover, it shall be appreciated that the above first embodiment can be applied to a case where the wiring metals are Al alloy, Cu, Ag, Au, Pt and so on in place of Al.

Embodiment No. 2

Figure 10A:
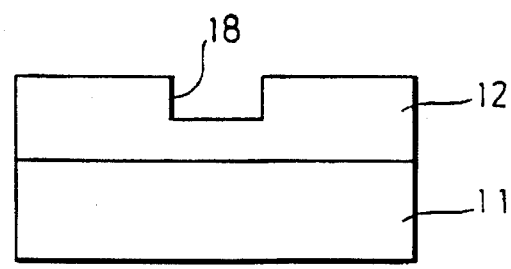
FIGS. 10A–10C show cross sectional views for making a semiconductor device according to the second embodiment.
Figure 10B:
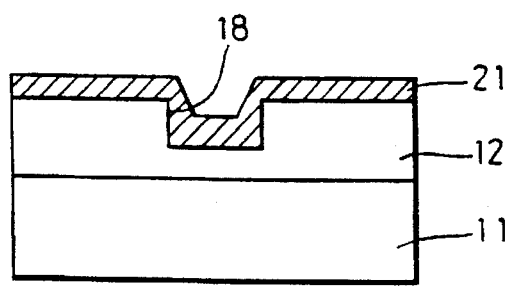
Figure 10C:
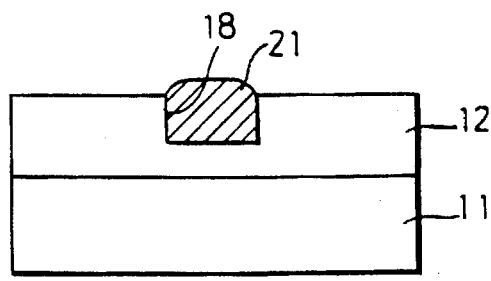

FIGS. 10A–10C show cross sectional views for making a semiconductor device according to the second embodiment.

In the second embodiment, there was used a substrate which is a single-crystal Si 11 of (100) surface orientation. A thermal oxide film 12 whose thickness is 1 µm was formed on the Si substrate 11, and on the thermal oxide film 12 there was formed a wiring pattern groove 18 whose depth and width are 0.02 µm–0.5 µm and 0.5 µm–2 µm, respectively, by means of the photo-lithography and a reactive ion etching (RIE).

Similar to the first embodiment, an inner surface of the groove 18 was formed with good wettability by the RIE method. Then, a mixed gas of CF$_4$ and H$_2$ was used and each gas of CF$_4$ and H$_2$ was supplied at a flow rate of 18 SCCM and 24 SCCM, respectively. A pressure at the time of etching was controlled at 40 mTorr, and an applied power at the time of etching was 800 W. Thereafter, a residual resist was removed in an atmosphere of oxygen plasma. Thereafter, cleansing was carried out in mixture liquid of sulfuric acid and hydrogen peroxide water.

Next, with reference to FIG. 10B, an Al thin film 21 was formed on the thermal oxide film 12 by a bias sputtering method without annealing thereon. Then, Al with purity 99.9999% was used for a sputtering target, and the Al was formed to the thickness of 0.02 µm–0.5 Ar was a gas that was utilized in the sputtering, a background pressure was less than $10^{-a}$ Torr, a pressure under sputtering was $3 \times 10^{-3}$ Torr, and an applied power was 8 kW, so as to form the film while suppressing the formation of the native oxide film.

Next, similar to the first embodiment again, the above device was annealed using a halogen lamp heater from a back side of the substrate under the same vacuum background as in the sputtering for duration of one minute, as shown in FIG. 10C. In other words, the device was in-situ annealed so that Al is filled in the groove as a result of agglomeration. An arriving temperature for this annealing process was carried out in a range of 300° C. through 660° C. Thereafter, Al which was left behind in a wide-range region where a wiring pattern was not formed was removed by means of a resist etchback method.

The Al film 21 formed using the bias sputtering method is such that the Al film thickness inside the groove 18 is rather thick and is rather thin in a flat region excluding the groove 18. Therefore, the agglomeration of the Al film starts from the flat region. Thus, the Al starts to move into the groove 18. As a result, an amount of the Al left behind in the flat region was reduced so as to make easy a removal process therefor. It shall be appreciated that any method may be utilized in place of the bias sputtering if the method realizes that the film thickness is rather thick inside the groove and is rather thin in the flat region excluding the groove.

The same things described in the first embodiment are applicable to the second embodiment here with regard to the angle of bottom face with respect to the side face, the angle of bent portion of the interconnection, the method to remove the residual wiring metal and the formation of separated dummy grooves depicted in the first embodiment.

When reliability of the Al formed in the second embodiment where the width thereof is 0.5 µm was tested in an acceleration test where the current density was $10^7$ A/cm$^2$ order, the reliability of less than 10 FIT was obtained under a test condition of 100° C.

In the above second embodiment, described is a film formation method where a wiring metal film thickness inside the groove is thicker than one in the flat region excluding the groove at the time of film formation. However, it is also desirable to perform a process in which after the film formation the film thickness inside the groove is made thicker than one in the flat region excluding the groove. For example, the film in the flat region excluding the groove is made thin by means of the resist etchback method or polishing method after the film is formed by the usual sputtering method; thereafter, the wiring metal is filled into the groove by agglomeration. When the native oxide film is formed on the surface of wiring metal film during the above process, the native oxide film shall be removed. By implementing the second embodiment or other similar methods, the residual wiring metal which is not filled in the groove can be significantly reduced.

Embodiment No. 3

The third embodiment deals with a method in which a film whose material is different from an interlayer insulating film is formed in the groove.

FIGS. 11A through 11E show cross sectional views for making a semiconductor device according to the third embodiment.

A single-crystal Si 11 of a (100) surface orientation is used for a substrate. In the third embodiment, a borophosphosilicate glass (BPSG) film 12 of 1 µm thickness was grown on the substrate 11 by a chemical vapor deposition (CVD) method, and a planar processing was performed on the BPSG film surface by a melt reflow method. This is because when there are left irregularities without the planar processing, the wiring metal may be filled into the groove where such metal filling is not needed therein. Thereafter, with reference to FIG. 11A, on the surface of the BPSG film there was formed a wiring pattern shaped groove 18 where both the depth and width are 0.5 μm, by the photolithography and the reactive ion etching (RIE).

Gases utilized in the RIE are mixture of $CF_4$ and $H_2$ which flow at a rate of 16 SCCM and 24 SCCM, respectively. A pressure at the time of etching was controlled at 40 mTorr and an applied power at the time of etching was 800 W. Thereafter, a resist was removed therefrom in an atmosphere of oxygen plasma. Thereafter, cleansing was carried out in mixture liquid of sulfuric acid and hydrogen peroxide water.

Figure 11A:
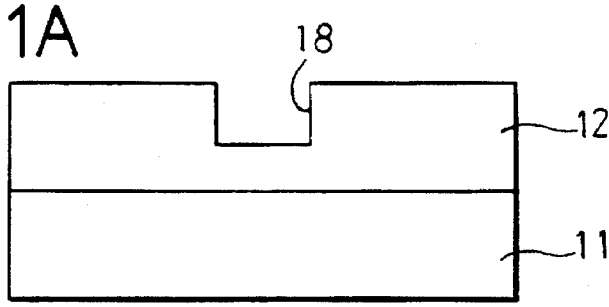
FIG. 11A–11E show cross sectional views for making a semiconductor device according to the third embodiment.
Figure 11B:
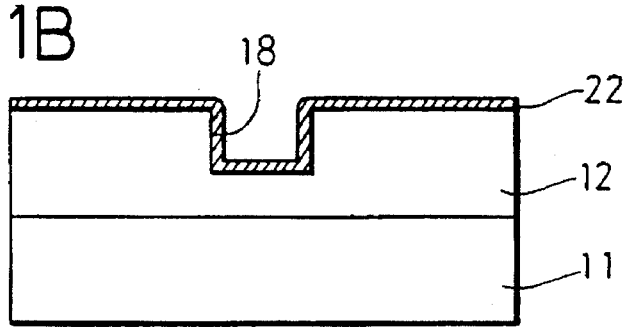
Figure 11C:
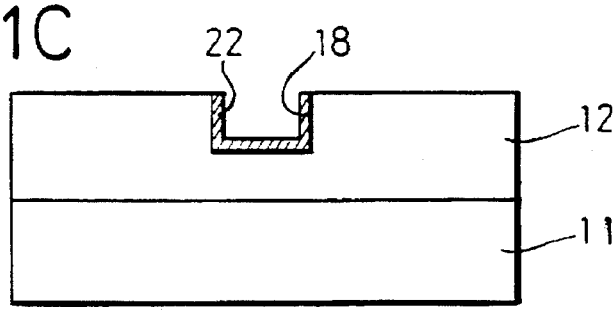

Next, with reference to FIG. 11B, an Nb (niobium) thin film 22 was formed on the BPSG film 12 by a d.c. magnetron sputtering method without annealing thereon. Then, Nb with purity 99.9999% was used for a sputtering target, and Nb was formed at thickness of 50 nm. Ar was a gas that was utilized in the sputtering, a background pressure was less than $10^{-8}$ Torr, a pressure under sputtering was $3 \times 10^{-3}$ Torr, and an applied power was 1 KW. Thereafter, with reference to FIG. 11C, Nb film located at other than the groove was removed.

Figure 11D:
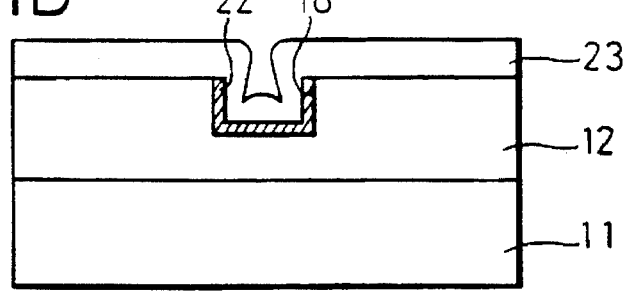
Figure 11E:
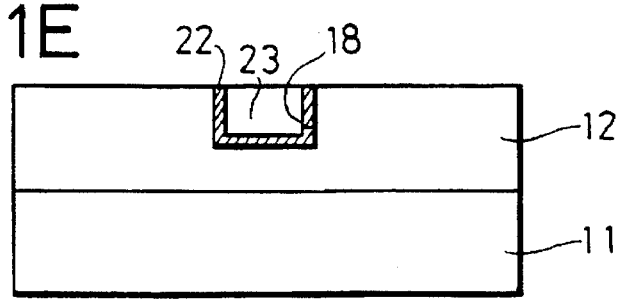

Thereafter, with reference to FIG. 11D, a Cu thin film 23 is grown over the substrate without annealing by the d.c. Magnetron sputtering method. Then, Cu with purity 99.9999% was used for the sputtering target, Cu was grown to thickness of 0.4 μm. Ar was a gas that was utilized in the sputtering, the background pressure was less than $10^{-a}$ Torr, the pressure under sputtering was $3 \times 10^{-3}$ and the applied power was 1 KW, so as to form the Cu thin film suppressing the formation of the native oxide film thereon.

Next, the above device went through an annealing process under the same vacuum background as in the sputtering for duration of one minute so as to fill Cu into the groove by agglomeration. In other words, the device was in-situ annealed so that Cu was filled into the groove as a result of agglomeration. The annealing process was performed at 550° C. Thereafter, with reference to FIG. 11E, the Cu left behind a wide-range flat portion was removed by the mechanical polishing method.

The reason why Nb is used for a substrate for Cu is that Nb has a high barrier characteristic against Cu and Nb has a superior adhesion in an interface between Cu and Nb, so that the agglomeration is not likely to occur on Nb and thus the Cu on the flat BPSG region can be effectively moved into the groove.

The Cu film thus formed is superior in orientation characteristic, and enlargement of grain size thereof was confirmed by an X-ray diffraction method and a transmission electron microscope (TEM) evaluation.

When reliability of the Cu formed in the third embodiment where the width thereof is 0.5 μm was tested in an acceleration test where the current density was $10^x A/cm^2$ order, the reliability of less than 10 FIT was obtained under a test condition of 100° C.

Moreover, though in the third embodiment the Cu thin film is formed by the d.c. magnetron sputtering method, the bias sputtering may be used instead so that the wiring metal film thickness inside the groove is thicker than one in the flat region excluding the groove as in the second embodiment. Moreover, the same things described in the first and second embodiments are applicable to the third embodiment here with regard to the angle of bottom face with respect to the side face, the angle of bent portion of the interconnection, and the method to remove the residual wiring metal.

Embodiment No. 4

In the fourth embodiment, there is shown a method for forming a second wiring thin film onto a first metal thin film which is filled in the groove by the agglomeration.

FIGS. 12A–12D and FIGS. 13A–13C show cross sectional views for making a semiconductor device according to the fourth embodiment.

Figure 12A:
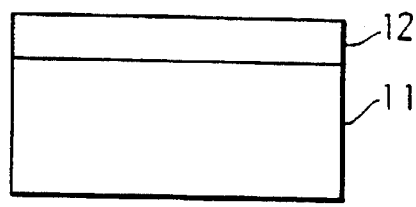
FIGS. 12A–12D and FIGS. 13A–13C show cross sectional views for making a semiconductor device according to the fourth embodiment.

With reference to FIG. 12A, a single-crystal Si was used for a substrate 11, and a thermal oxide film 12 was formed on the Si substrate 11 at thickness of 100 nm.

Figure 12B:
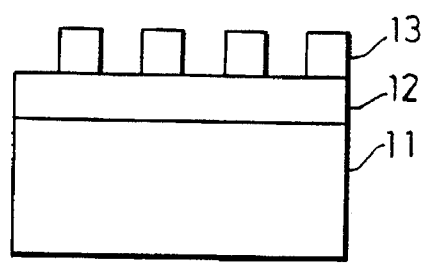

Next, with reference to FIG. 12B, after a resist was applied, a mask pattern 13 was formed using the usual photo-lithography. In case where a fine mask pattern 13 can not be formed by the usual photo-lithography, there may be used an electron beam lithography. Then, a shape for the mask pattern 13 is formed such that a plurality of straight-line-shaped grooves are arranged in parallel periodically. The depth of groove is 0.6 μm and the pitch is 1.2 μm.

Figure 12C:
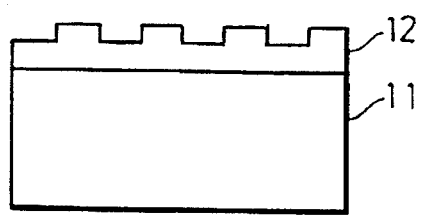

Thereafter, with reference to FIG. 12C, etching was performed on the thermal oxide film at a thickness of 50 nm using the RIE so as to form the groove, and the resist was removed. Then, gas utilized in the etching was $CF_4$, an etching pressure was 7.8 mTorr, and the applied power was 50 W. By the RIE, the bottom face and side face of the groove are made so that wettability thereof is good.

Figure 12D:
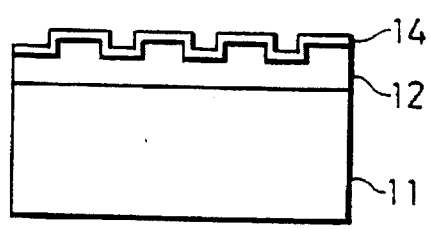

With reference to FIG. 12D, on the thermal oxide film 12 in which the grooves were formed by a patterning described above, a first Al film 14 whose purity is more than 99.999% was deposited at the thickness of 20 nm at a room temperature by means of the d.c. magnetron sputtering. The gas utilized for the sputtering was At, the background pressure was less than $10^{-a}$ Torr, the sputtering pressure was $3 \times 10^{-3}$ Torr, and the applied power was 6 KW, so as to form the first Al film suppressing the formation of the native oxide film thereon.

Figure 13A:
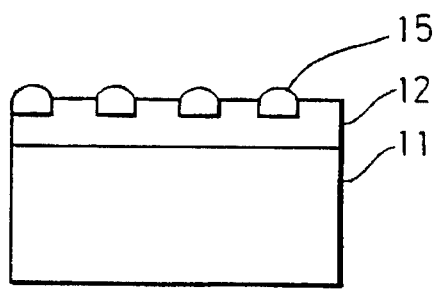

Thereafter, with reference to FIG. 13A, in the same manner as in the previous embodiments, the substrate 11 was annealed at 350° C. for one minute under the condition that the background pressure in the sputtering was kept intact, namely, the formation of the native oxide film on the first Al thin film was being suppressed, so that the first Al thin film was agglomerated and an Al crystal seed 15 was formed inside the groove. Now, there is almost no native oxide film grown on the surface of the crystal seed 15.

Figure 13B:
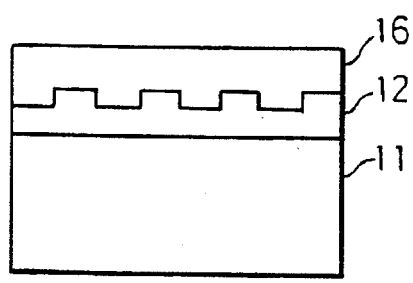
Figure 13C:
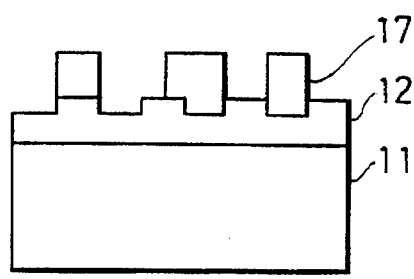

Thereafter, with reference to FIG. 13B, keeping the state of the above background pressure (namely the above vacuum level) and of suppressing the formation of the native oxide film on the surface of the Al crystal seed, a second Al thin film 16 was formed at the thickness of 380 nm by the sputtering. Then, the sputtering was performed under the same condition as in the formation of the first Al thin film.

Then, the device was annealing-processed at 450° C. for 15 minutes at an atmosphere of mixture of hydrogen and nitride. Lastly, the resist mask was formed and Al thin film consisting of the first Al thin film and the second Al thin film is etching-processed so that an electrode wiring pattern 17 is formed.

Figure 14:
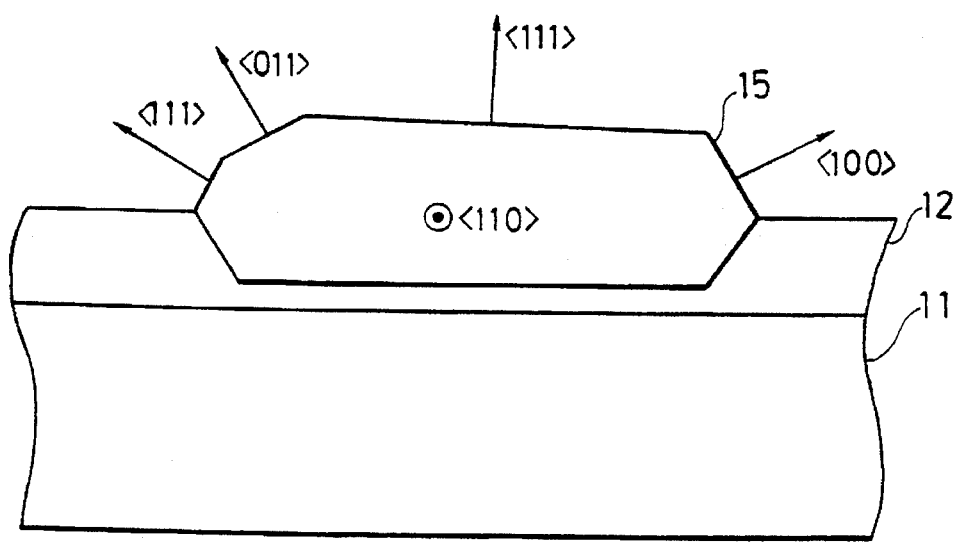
FIG. 14 shows an orientation relationship between the groove formed on the thermal oxide film 12 and the Al crystal seed 15.

FIG. 14 shows an orientation relationship between the groove formed on the thermal oxide film 12 and the Al crystal seed 15. The same figure presents an example of a cross sectional view of Al crystal seed filled in the groove. Identifying each crystal facet from an angle thereof, the respective crystal facets were learned as shown in FIG. 14. Moreover, by observing the cross sections of other crystal seeds, it was learned that a cross sectional shape determined by the crystal facet was equal and the in-plane orientation of the crystal seed was controlled in the surface thereof so as to indicate the same orientation.

Figure 15A:
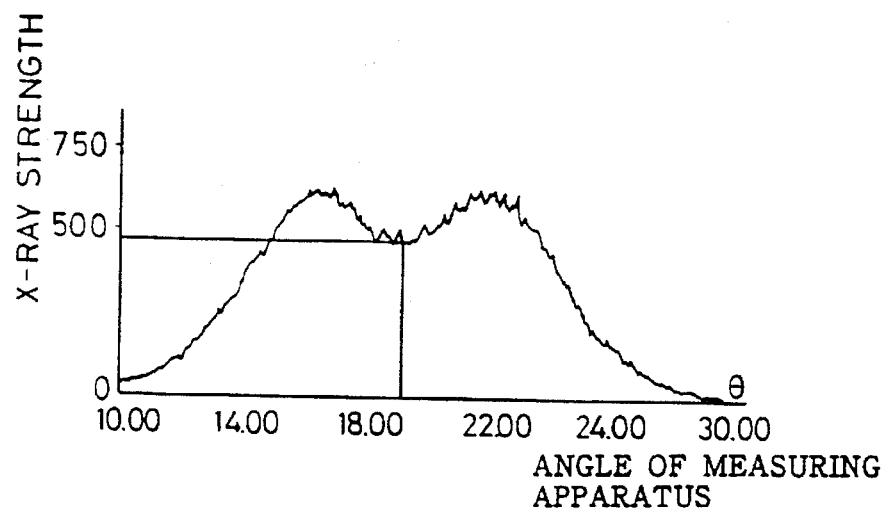
FIGS. 15A–15C show results for a preferred <111> direction oriented normal to the substrate observed by the X-ray diffraction technique.
Figure 15B:
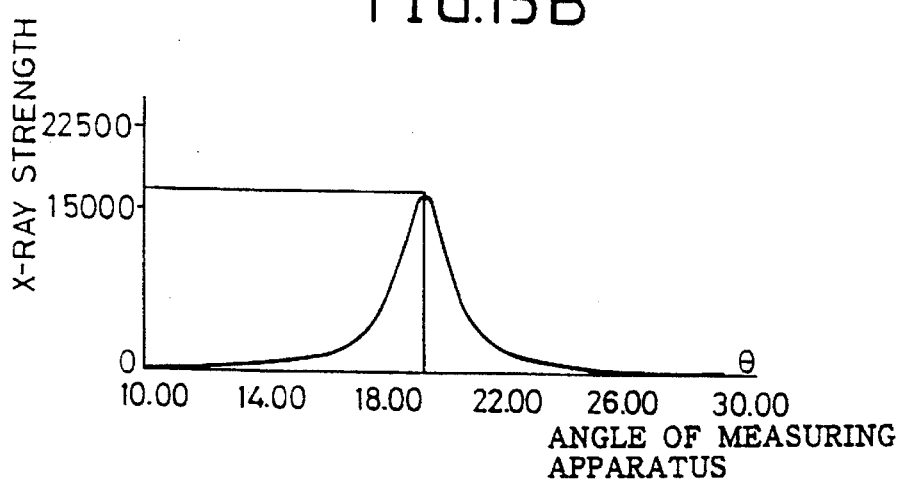
Figure 15C:
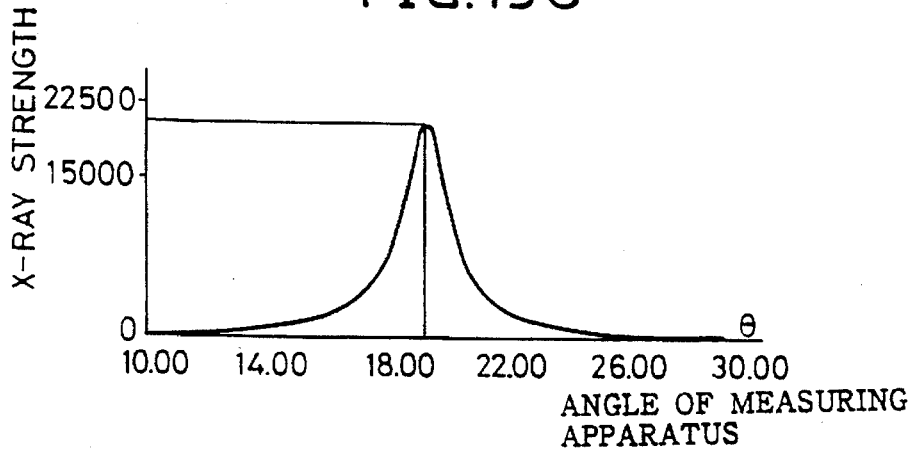

FIGS. 15A–15C show results for a preferred <111> direction oriented normal to the substrate observed by the X-ray diffraction technique. Profiles shown in FIG. 15 are so-called rocking curves. A diffracted X-ray is detected such that the X-ray incident angle is aligned to an angle according to the Al <111> direction. The narrower a full width at half-maximum intensity of the peak is, the smaller a dislocation in the crystalline orientation is such that orientation degree is superior.

With reference to FIG. 15A, there is shown the rocking curve of Al formed by the conventional method, where a peak is divided in two. The same figures indicate that each of the crystal grain existing in the film interacts to each other, thus deteriorating the orientation thereof.

On the other hand, by implementing the fourth embodiment, peaks shown in FIG. 15B and FIG. 15C are obtained which is very sharp. FIG. 15B shows a peak of the Al film which is formed on the thermal oxide film, on which surface there is no groove formed. FIG. 15C shows a peak of the Al film which is formed on the thermal oxide film where there are formed the grooves shown in FIG. 12 and FIG. 13.

With reference to FIG. 15B, even in case where there is no groove formed on the thermal oxide film, the full width at the half-maximum intensity of the peak is narrowed compared to the Al film formed in the conventional film formation method. By this fact, it is clearly indicated that the further preferred orientation is effected in a method where the first Al film is separated so as to form a crystal seed (though not shown) and the second Al film is grown based on the crystal seed.

With reference to FIG. 15C to show the peak for the Al film which is formed on the thermal oxide film having the grooves thereon, the peak is further narrowed compared to the case where there is formed no groove, so that forming the groove on the surface of the thermal oxide film further improves the further preferred orientation characteristic.

When reliability of 1 μm wiring formed according to the fourth embodiment here was evaluated in the acceleration test where the current density was $10^x A/cm^2$ order, the reliability less than 10 FIT was obtained.

Figure 16A:
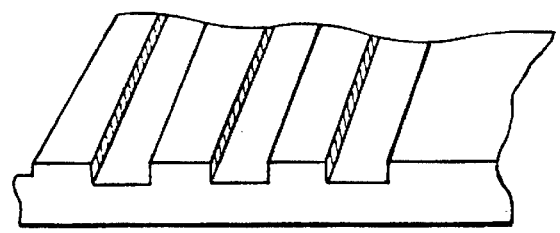
FIGS. 16A–16C show various shapes for the groove according to the fourth embodiment.
Figure 16B:
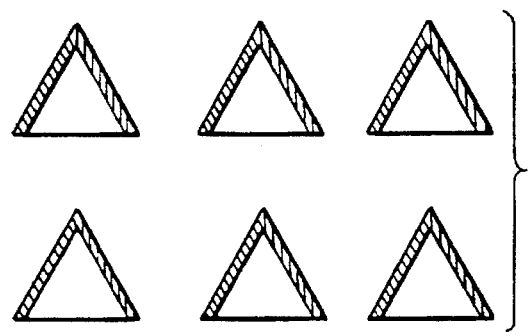
Figure 16C:
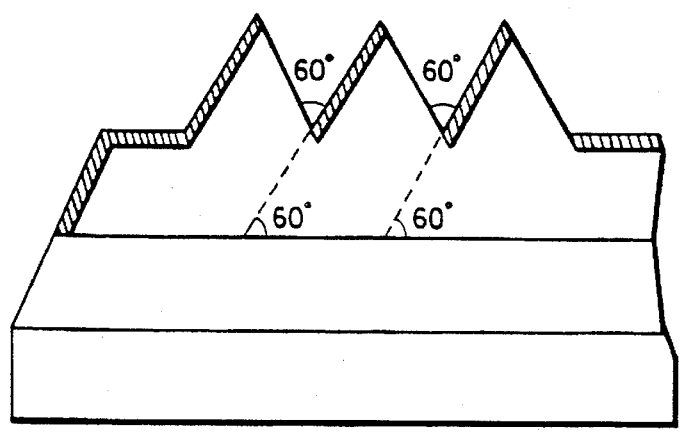

With reference to FIG. 16A, the grooves formed on the surface of the thermal oxide film are a plurality of parallel straight-line-shaped ones. However, with reference to FIG. 16B, the grooves may be arranged in a plurality of equilateral triangles in a manner that each corresponding side of the equilateral triangle is parallel. With reference to FIG. 16C, the grooves may also be arranged in a saw shape in a manner that an angle between the neighboring sides, an angle between a side and an extended line of the other side, and an angle of extended line of each side are all 60 degrees.

In any of above cases, the crystal seed formed by agglomeration of the first thin film was filled into the groove and an in-plane rotation for the crystal grains is controlled in the same manner as in the straight-line grooves, so that the reliability of interconnection formed was improved.

In the fourth embodiment, a method is described where the usual sputtering was used when the first metal film was formed. It shall be appreciated that in the course of film formation the wiring metal film thickness inside the groove may be thicker than one in the flat region excluding the groove as in the second embodiment. Moreover, it shall be appreciated that after formation of the film the wiring metal film thickness in the region outside the groove may be made thinner than one in the groove, or the wiring metal film outside the groove may be removed by a certain process. Thereafter, when there is grown the native oxide film on the surface thereof, it is preferred to carry out a process to remove the native oxide film. Moreover, when the wiring metal film located outside the groove is all removed, the wiring metal film may be agglomerated.

Embodiment No. 5

In the fifth embodiment, a volume of the wiring metal to be filled into the groove is minimized and a uniformly filled wiring is realized by using a wettability improved layer.

FIGS. 17A–17D shows cross sectional views for making a semiconductor device according to the fifth embodiment.

A single-crystal Si (100) 11 is used for a substrate. In the fourth embodiment, with reference to FIG. 17A, a thermal oxide film 12 of 1 μm thickness was grown on the Si substrate 11, and on the thermal oxide film there is formed a wiring pattern groove 18 whose depth and width are 0.4 μm and 0.6 μm, respectively, by a photo-lithography and a reactive ion etching (RIE).

In the RIE, there is preferably used a mixture gas of $CF_4$ and $H_2$ and each gas is preferably supplied at a flow rate of 18 SCCM and 24 SCCM, respectively. A pressure at the time of the etching is preferably controlled at 40 mTorr, and an applied power at the time of the etching is preferably 800 W. Thereafter, a residual resist is removed in an atmosphere of oxygen plasma. Thereafter, cleansing is carried out in mixture liquid of sulfuric acid and hydrogen peroxide water.

Figure 17A:
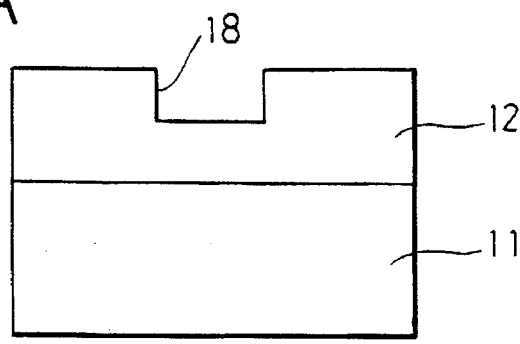
FIGS. 17A–17D shows cross sectional views for making a semiconductor device according to the fifth embodiment.
Figure 17B:
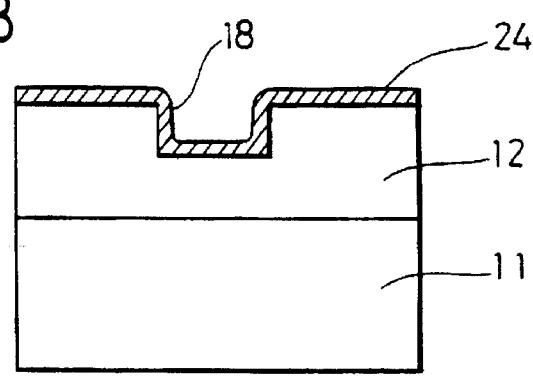

Next, with reference to FIG. 17B, a C (carbon) film 24 is formed on the thermal oxide film 12 by the magnetron sputtering. Then, the thickness of the C film was varied at 0.02 μm. 0.05 μm, 0.1 μm and 0.2 μm. Ar gas was utilized in the sputtering, a background (vacuum) pressure was less than $10^{-a}$ Torr, a pressure under sputtering was $3 \times 10^{-3}$ Torr, and an applied power was 4 KW.

Figure 17C:
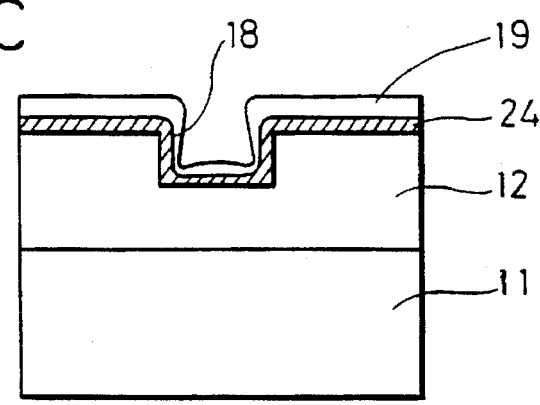

Next, with reference to FIG. 17C, an Al thin film was formed on the C film 24 sequentially by the d.c. magnetron sputtering technique at the thickness of 0.1 μm through 0.8 μm without annealing thereon. Then Al with purity 99.9999% was used for a sputtering target. Ar was the gas that was utilized in the sputtering, the background pressure was less than $10^{-8}$ Torr, the pressure during the sputtering was $3 \times 10^{-3}$ Torr, and the applied power was 6 KW, so as to form the Al film while suppressing the formation of the native oxide film on the Al surface.

Figure 17D:
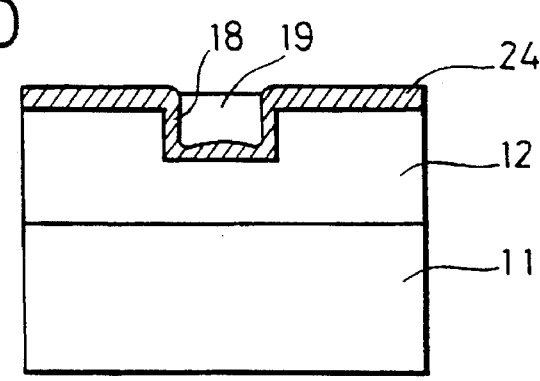

Next, with reference to FIGS. 17C and 17D, the above device was annealed using a halogen lamp from a back side of the substrate under the same vacuum background as in the sputtering for duration of 45 seconds. In other words, the device was in-situ annealed so that Al is filled in the groove as a result of agglomeration. The arriving temperature was varied from 300° C. through 660° C.

Thereafter, Al which was left behind in a wide-range region where a wiring pattern was not formed was removed by a chemical mechanical polishing technique. Thus the polishing was stopped by the time when removal of the residual Al in the flat portion was completed, so that the surface of the Al interconnection was not polished more than what is necessary After polishing, still remaining C film 24 was removed in an $O_2$ plasma.

Figure 18:
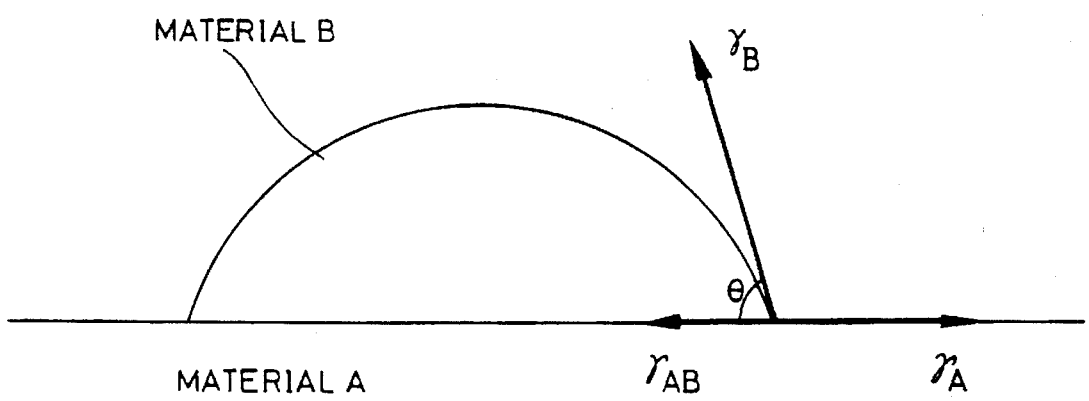
FIG. 18 shows that material B on a flat material A becomes orbicular shape under a thermal equilibrium state.

The wettability of material is determined by the balance among a surface tension and interfacial tension of the material. With reference to FIG. 18, it is well known that liquid material B placed on solid material A becomes a spherical shape under a state of thermal equilibrium. In this state, a total free energy in a surface tension and interfacial tension is minimized so that the material becomes stable. Then, the surface tension (γA), the interfacial tension between the material A and material B (γAB), and the surface tension of material B (γa) are balanced such that the following Young's equation holds.

$$\gamma B \cos(\widehat{H}) = \gamma_A - \gamma_{AB} \quad (1)$$

where $\widehat{H}$ represents a angle between material A and a contact portion of material B, and is often called a contact angle. The surface or interfacial tension under the thermal equilibrium is determined by material alone regardless of a state thereof. Therefore, when it is expressed that wettability between material A and material B is good or improved, what is meant is that the contact angle is relatively low.

In the fifth embodiment, the C film 24 was used as a wettability improving layer in order to improve the wettability between the Al and the substrate, so that efficiency of filling the Al into the groove was improved. Let us show by a simulation that the better the wettability between an upper layer and a lower layer deposited on the upper layer is, the efficiency of the upper material into the groove formed on the surface of the lower material is improved.

The surface energy under a system of the thermal equilibrium state is expressed by the following equation.

$$E = S_A \gamma_{AB} + S_{AB} \gamma_{AB} + S_B \gamma_B \quad (2)$$

where $S_A$, $S_{AB}$ and $S_B$ are a surface area of the material A, an interfacial area between the material A and material B, and a surface area of the material B, respectively, in the system thereof.

Figure 19A:
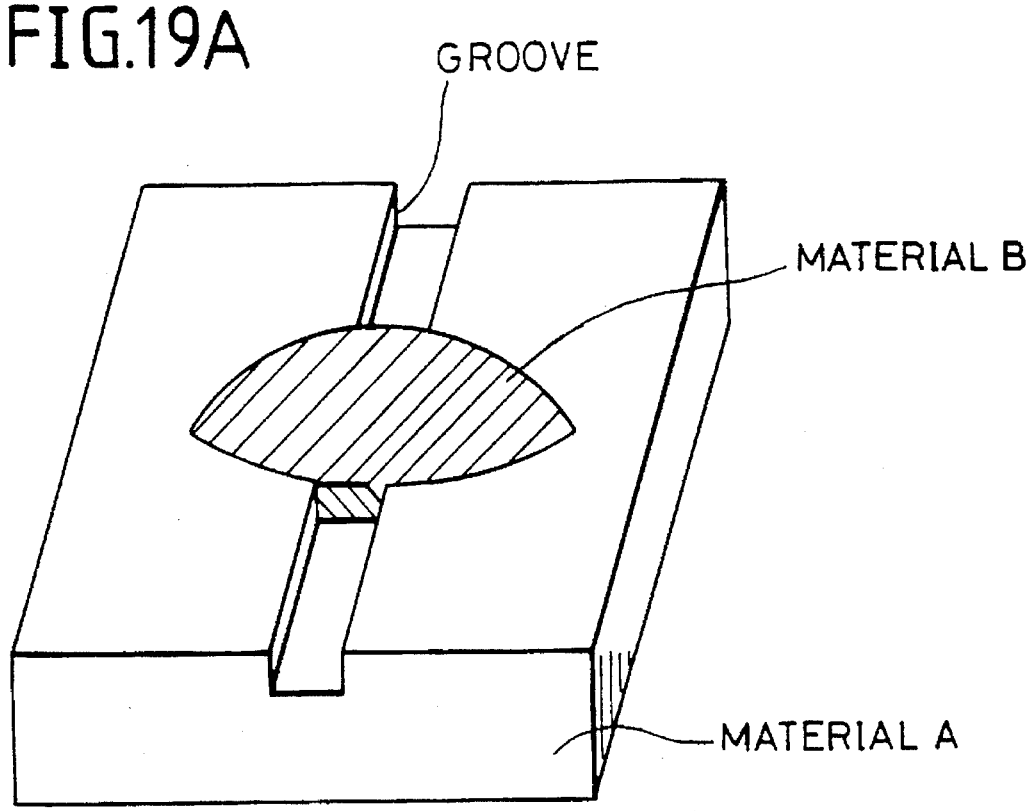
FIG. 19A and 19B show a system 1 where the material B is agglomerated orbicularly on the substrate material A having a groove therein and a system 2 where the materila B is filled into the groove, respectively.
Figure 19B:
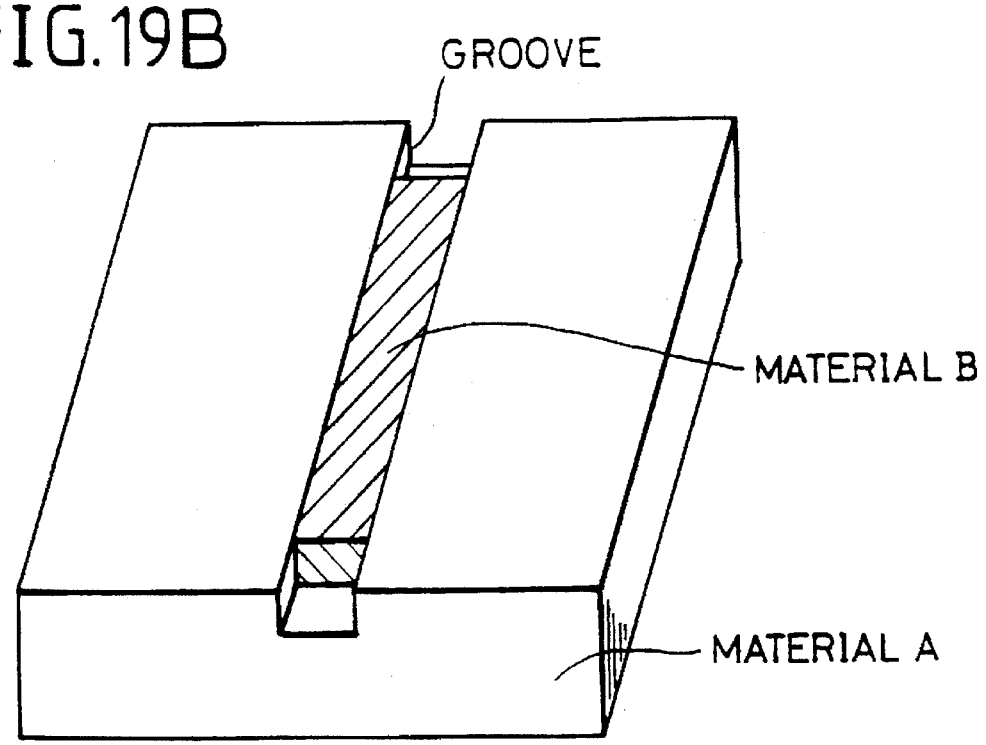

Next, with reference to FIG. 19A, there is shown a system 1 where there is a groove on the surface of the material A and the material B is agglomerated spherically on the surface of the material A having the groove. With reference to FIG. 19B, there is shown a system 2 where the material B is filled into the groove. A free-energy change ΔE between the system 1 and the system 2 is expressed as follows using equations (1) and (2).

$$\begin{aligned}\Delta E &= E_1 - E_2 \quad (3)\\ &= \{S_{B1} - S_{B2} + (S_{AB2} - S_{AB1})\cos\Theta\} \gamma_B = K \cdot \gamma_B\end{aligned}$$

where K is a coefficient with regard to the surface tension γB of material B, and subscripts therefor show respective systems. The surface tension γB of the material B is a positive real number which is determined by types of material, so that when K is positive $\Delta E = E_1 - E_2 > 0$ thus $E_1 > E_2$. When the surface energy $E_1$ of the system 1 is lower than the surface energy $E_2$ of the system 2, the system shifts to one whose surface energy is lower.

Figure 20:
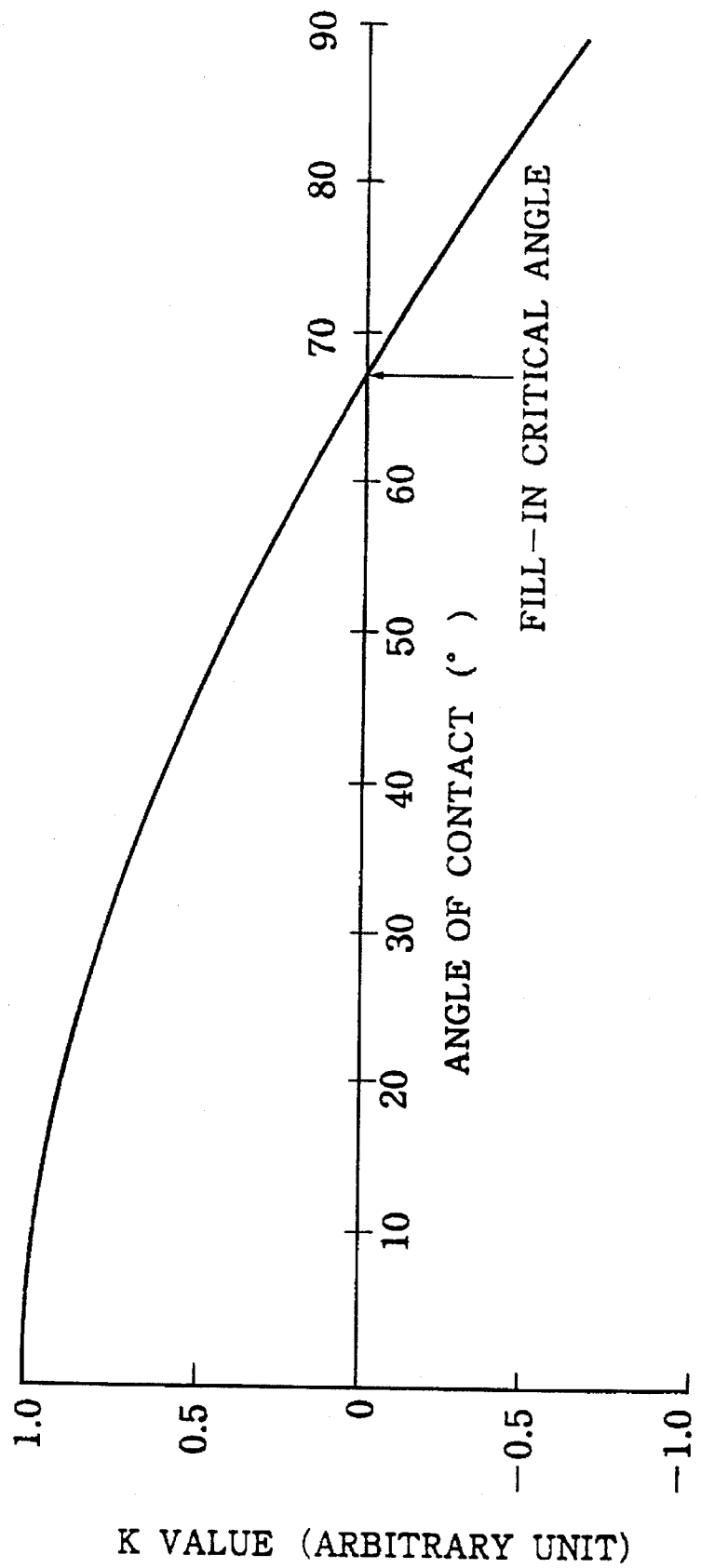
FIG. 20 is a graph showing dependency of value K upon the contact angle (H).

FIG. 20 is a graph showing the contact angle dependence on value K, which means the free energy change normalized by surface tension γB. In the same figure, a vertical axis in the graph shows a value of K in an arbitrary unit, whereas a horizontal axis shows a value of the contact angle. In this calculation, a volume of material B is assumed constant regardless of the contact angle. Moreover, in order to compare with an experimental result, the width and depth of the groove are 0.6 μm and 0.4 μm, respectively so that the size thereof was assumed to be sufficient to fill in the volume of material B.

With reference to FIG. 20, the value of K is positive when the contact angle is less than 67°. Now, θ is defined to be a fill-in critical angle such that the value of K becomes 0. It is indicated that under less than the fill-in critical angle (that is less than 67° in this case) the system 2 where material B is filled in the groove presents less surface free energy thus more stable than the system 1 where material B is agglomerated spherically on the material A having the groove therein. Moreover, when the contact angle approaches to zero, that is, the wettability improves, the value of K increases, thus the fill-in efficiency being improved.

The above simulation was obtained with the width and depth of the groove being 0.6 μm and 0.4 μm, respectively, and when the size of the groove differs from the above simulation the value of fill-in critical angle thereof would vary. However, when the contact angle is less than the fill-in critical angle, the tendency at which the material B is filled in the groove formed in the material A is invariant.

It is obvious that the tendency is determined only by the wettability (contact angle) of material A and material B, regardless of material used then.

Figure 21:
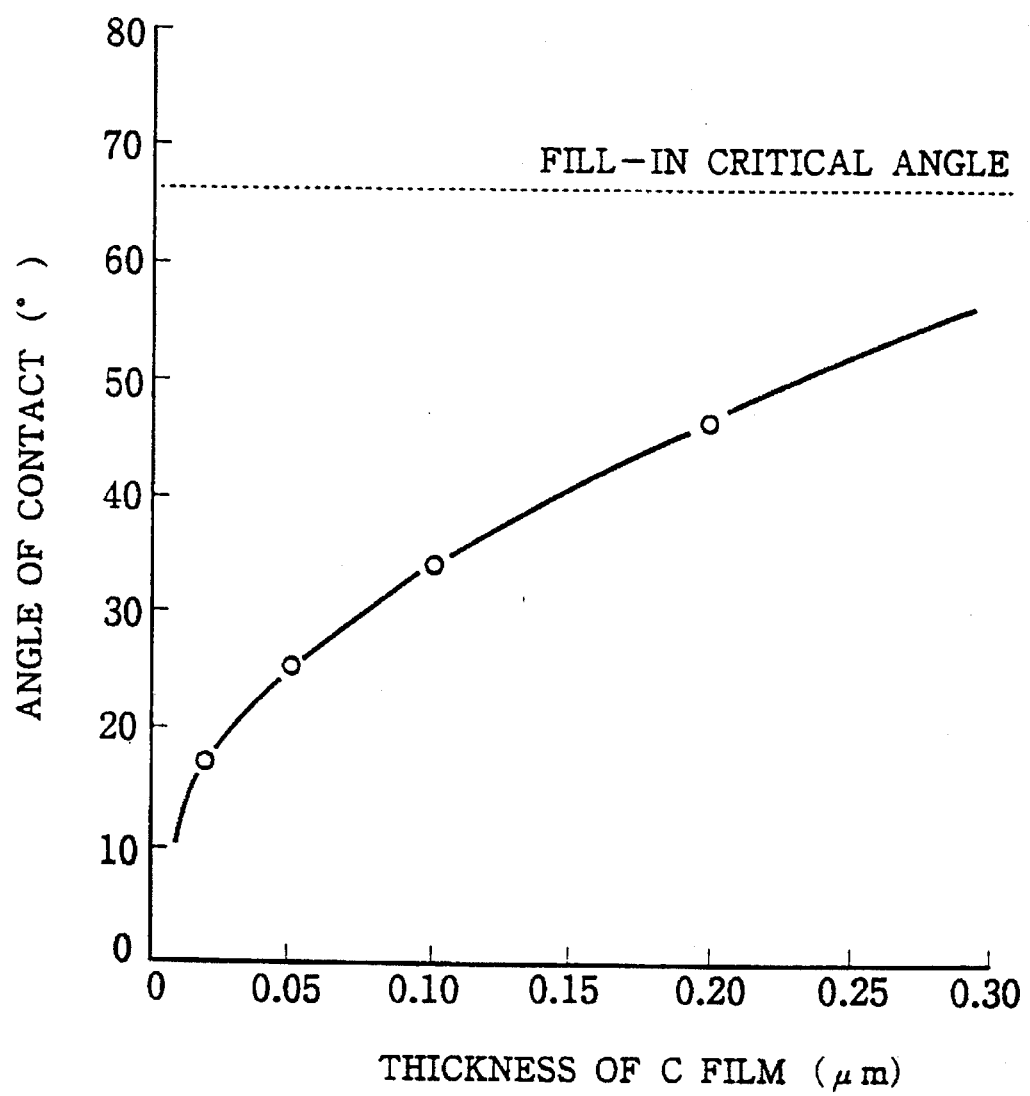
FIG. 21 shows a correlation between the contact angle of Al and C and the film thickness.

In the fifth embodiment, there is used the C film 24 for the wettability improving layer. The C film 24 differs in wettability against Al depending on the film thickness of the C film 24. FIG. 21 shows a correlation between the contact angle of Al and C and the film thickness In this measuring of the contact angle, after the C film with thickness at 0.02 μm, 0.05 μm, 0.1 μm and 0.2 μm is formed on the flat thermal oxide film, the Al film of 0.05 μm thickness is formed and then agglomeration with in-situ annealing is caused at 500° C. for 45 seconds. When the thickness of C film is less than approximately 0.02 μm, angle contacts thereof is below the fill-in critical angle of 67° calculated previously (where the width and depth of the groove are 0.4 μm and 0.6 μm, respectively).

Moreover, a groove is formed on the thermal oxide film, thereafter, the C film 24 with various film thicknesses is formed and the Al film is filled into the groove by agglomeration. For fill-in efficiency purpose, after the formation of film 24, the groove is formed with the width and depth at 0.6 μm and 0.4 μm, respectively and at an interval of 1.2 μm, thereafter the film 24 is formed and the number of Al islands is counted which is spherically agglomerated thereon. As a result thereof, it is learned that the smaller the contact angle becomes, the less the number of the Al islands which agglomerate becomes so as to improve the Al fill-in efficiency.

Moreover, when the spherically agglomerated Al island is in contact with the Al lines filled in the groove, that there exists a grain boundary in the vicinity of the contact portion was discovered for the first time by the applicant using a TEM (Transmission Electron Microscope). This phenomena was speculated in that the Al lines in the groove orient preferentially through an inner surface of the groove so that the crystal orientation thereof is regularly determined while the spherically agglomerated Al island has a small contact area with the inner surface of the groove so that a crystal orientation is random.

The spherically agglomerated Al island is often formed extending over the single-crystal interconnection which are filled in a plurality of grooves, thus causing a problem of a conductivity of the interconnection. Even in a case where the spherically agglomerated Al islands in contact with the single-crystal interconnection can be removed at a later process, there may be remained a crystal grain boundary in a portion of the single-crystal interconnection after the removal thereof, thus possibly contributing to the reduction of wiring reliability.

In order to solve such problems, it is necessary to avoid the case where the volume of Al to be filled in the groove is in excess of what is necessary so that the spherically agglomerated Al islands are formed and to avoid the case where the Al volume is in short of what is necessary so that the interconnection is disconnected. In the above experience and calculation, there has been demonstrated that the fill-in efficiency to the groove is improved by improving the wettability and in this case it was assumed that the volume of material to be filled in is equal to or less than the volume of the groove. However, in real electrode wiring of the semiconductor device, the position and shape of the interconnection differs according to a use thereof, so that there exist portions whose wiring is dense and otherwise not that densely made.

When the material B on the flat material A is agglomerated with annealing as described above, the material B forms some spherical agglomerations. When there is provided the groove on the material B, the annealed thin film of material B tends to be spherically agglomerated in order to stabilize the surface free energy. However, when the agglomeration is extended over the groove, the film can be more stabilized if it is filled into the groove.

Figure 22A:
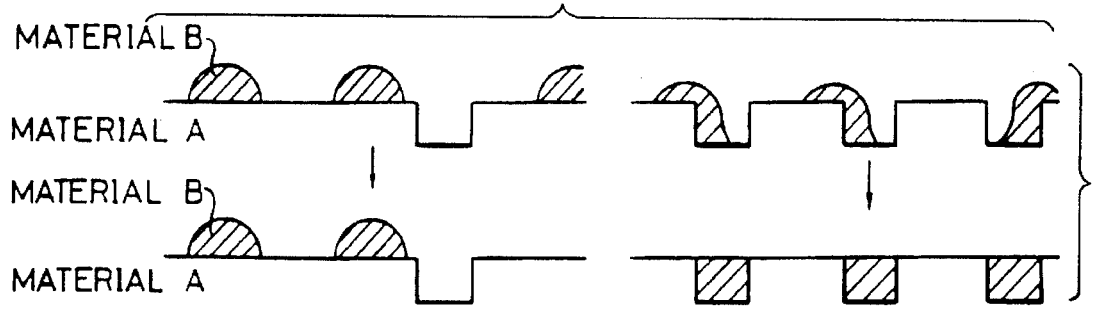
FIGS. 22A–22C illustrate a case where material B is filled into the material B where there exist both a densely located wiring groove and a non-densely located wiring groove on the same device.
Figure 22B:
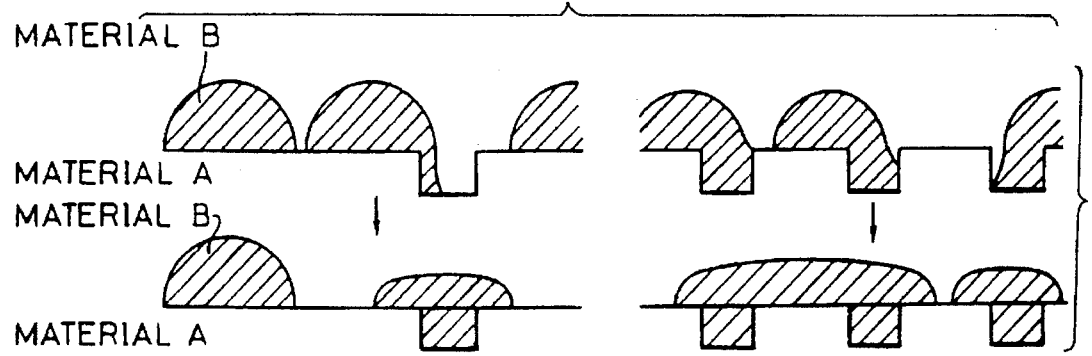

With reference to FIG. 22A, where there exist both a densely located wiring groove on the right side of the figure and a non-densely located wiring groove in the same device on the left side of the figure, an agglomerated metal boundary is extended over the groove so that it can be filled into the groove when the wiring groove is located densely, while some of the agglomerated metal may not be filled into the groove when the groove is located non-densely. In order to solve this problem, with reference to FIG. 22B, the film thickness of the material B is increased so as to increase the boundary area of the agglomerated metal. However, though the agglomerated material is extended over the groove so as to be filled into the groove, the material B which exceeds the volume of the wiring groove is agglomerated spherically on the interconnection, thus causing to form the grain boundary.

Figure 22C:
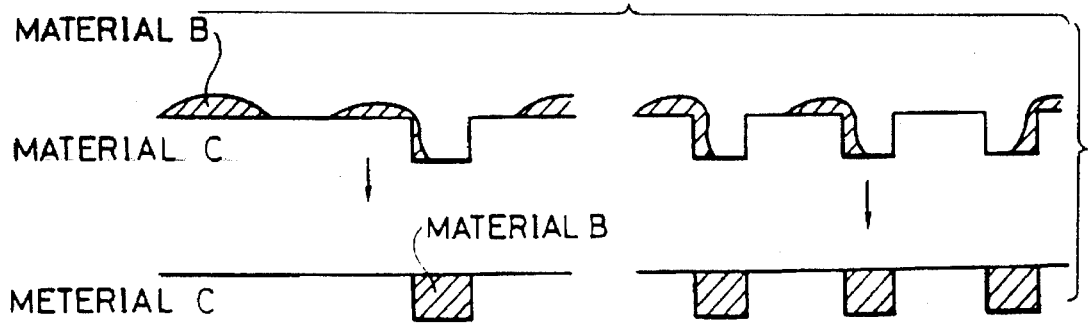

Thus, with reference to FIG. 22C, by providing the groove in the material C which has a good wettability with the material A, the contact angle thereof was decreased and the boundary area was increased without increasing the volume of the agglomeration material, so that a uniform filling was achieved regardless of whether the groove is located densely or not. Accordingly, the control of the wettability can improve the fill-in efficiency so as to reduce the surface energy but also control the volume of the metal which is to be filled in the groove.

Therefore, it is desirable that, in the course of forming a single-crystal wiring by uniform filling, the wettability shall be improved and the film thickness of the wiring metal shall be controlled to a necessary minimum such that the amount of the metal is sufficient to fill in the volume of wiring groove.

Then, suppose that an area where the wiring grooves are most densely located in the substrate is indicated with S, a total volume of the grooves in the area is V, and the film thickness formed through out the substrate is t, the wiring metal is preferred to be formed such that St=V holds.

When the reliability is evaluated on the Al wiring of 0.5 μm width in the fifth embodiment under the acceleration test where the current density is $10^7/cm^2$ order, the reliability of less than 10 FIT was obtained under a test condition at 100° C.

In the fifth embodiment, there is used Al for the wiring metal, and there is used C film for the wettability improving film. When other material such as Cu, Ag and At other than the Al is used as the wiring metal, a wettability improving layer having a good wettability relative to the metal chosen shall be selected to have the same effect in the Al and C film.

In the fifth embodiment, the C film is sputtering-formed as the wettability improving layer. It shall be appreciated that the property of the substrate may be improved using an ion beam bombardment or heating.

For annealing of the substrate in the first through fifth embodiments above, the halogen lamp is used to anneal the device from the back side of the substrate. Instead, there may be adapted a method where the device can be annealed by heat conduction of a resistance heating type heater or the device can be heated by radiant heat from the resistance heating type heater.

Alternatively, there may be adapted a method where energy beam such as the electron beam and laser beam is irradiated locally. Moreover, the device may be heated by a high-frequency induction heating, and in this case material which is liable to be induction-heated shall be used especially for the substrate of the wiring electrode. Then, there may be adapted a heating in which the substrate is given a temperature gradient.

Figure 23:
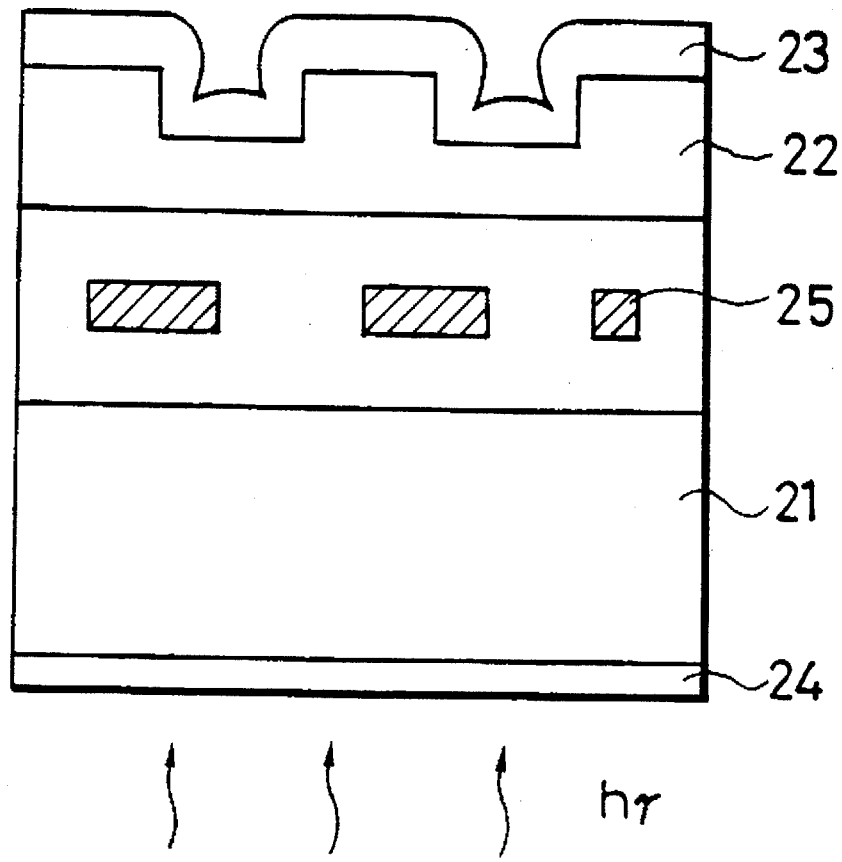
FIG. 23 shows a feature profile where there is provided a reflection preventing film such as C film and TiN film which are formed in the back side of the substrate through annealing.

In the back side heating by the halogen lamp or the like, there is caused a different level of light reflection due to a pattern placed in a lower layer, so that there may be caused an unevenness in temperature distribution. Therefore, with reference to FIG. 23, a reflection preventing film such as C 24 and TiN film may be formed in an upper or lower layer of the pattern or in the back side of the substrate so that thereafter the device is filled in by agglomeration through annealing. In FIG. 23, the reference numeral 24 is a C film, 21 is Si substrate, 25 is a substrate pattern, 22 is an insulator, and 28 is a wiring metal.

The reflection preventing film is such that the light is absorbed thereon and a generated heat is heated by the heat conduction. The reflection preventing film is not limited to the C film or TiN film and may be any material which absorbs the light.

Moreover, impurities may be diffused into the fill-in wiring. For example, when impurities such as Cu and Si are diffused into the Al fill-in wiring, the reliability of interconnection is further improved by depositing them on the grain boundary or the interface between the interconnection and groove.

In this case, there may be formed a thin film having the above impurities so that a predetermined amount of impurities is diffused by thermal annealing, or the impurities may be implanted by an ion implantation technique.

In the above first through fourth embodiments, there may be considered a method where on the insulator, a semiconductor film or the metal film there is formed a layer consisting of material having relatively inferior wettability against the film formed therebelow, and the layer having the inferior wettability is removed until the the surface of the insulator, the semiconductor film or metal film is exposed so as to form the groove.

In the first through fifth embodiments, when there is formed the native oxide film on the surface of the wiring metal film, the metal thin film may be filled into the groove by agglomeration after the native oxide film is removed. Then, the technique to be utilized for removing the native oxide film may be a physical sputtering using atoms such as Ar or a removal technique using an etching gas such as a halogen.

There are used the sputtering technique and the bias sputtering technique for film formation of the wiring metal.

Other techniques such as a vacuum vapor deposition technique, the CVD, a physical vapor deposition technique having an orientation property or the CVD with an orientation property.

Figures 24A, 24B:
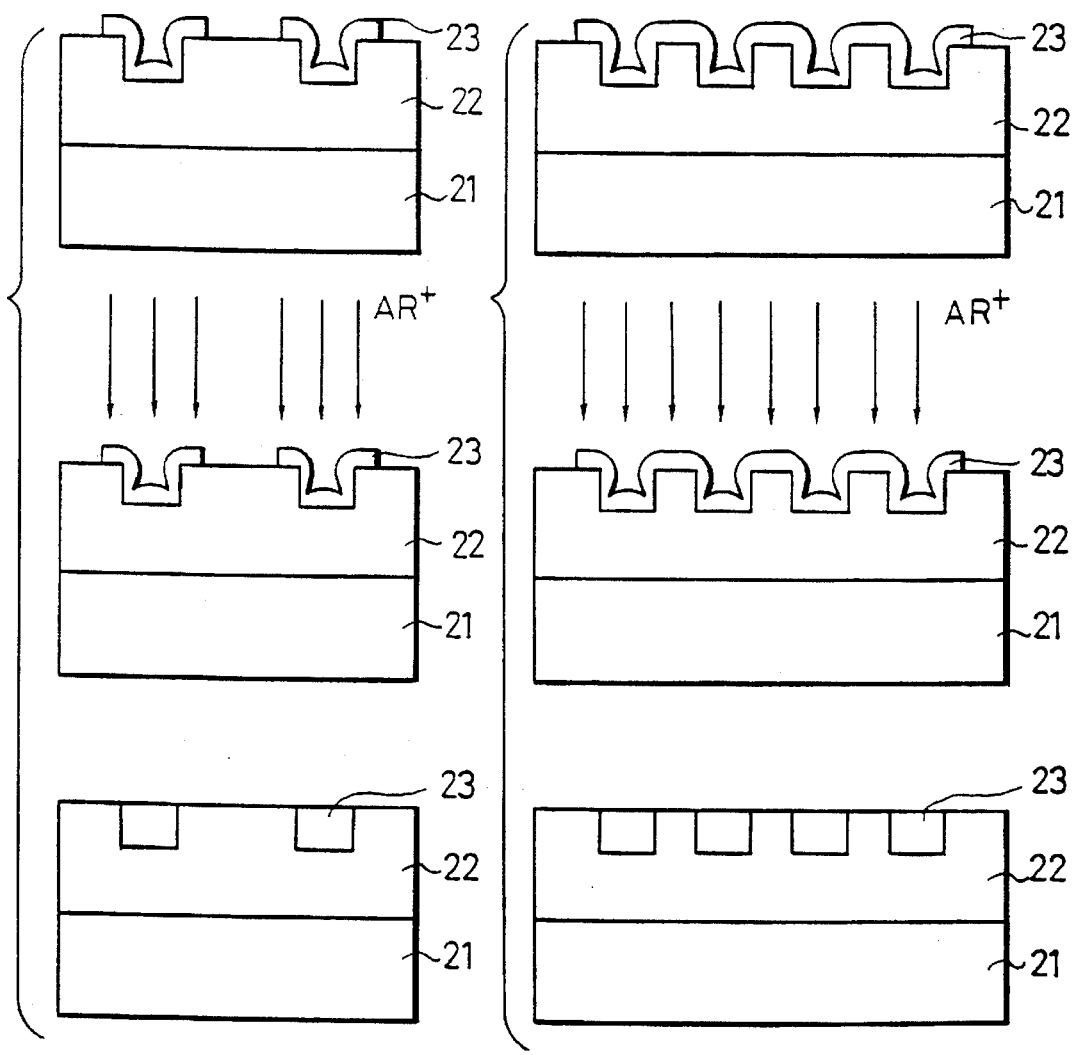
FIGS. 24A and 24B show cross sectional views showing that the metal thin film is agglomerated after the metal thin film on the groove is selectively removed.

With reference to FIG. 24A and FIG. 24B, the metal thin film may be agglomerated after the metal thin film over the groove is selectively removed in manner that the metal thin film which is wider than the width of the groove extends over the groove. Namely, with reference to FIG. 24A, after the wiring metal film is selectively removed, the native oxide film is removed by an reverse sputtering of Ar ion or the like. Thereafter, annealing is performed so that the metal thin film is filled into the groove by agglomeration.

With reference to FIG. 24B where the pattern is dense in that the grooves are densely located, the continuous metal thin film may be deposited over a plurality of grooves. Thereafter, the native oxide film is removed by the reverse sputtering of Ar ion or the line, so that the metal thin film is filled into the groove by agglomeration.

Moreover, the wiring metal is filled in the groove of the wiring region by agglomeration, and the residual excess metal film may be left in the region of no wiring.

Figure 25A:
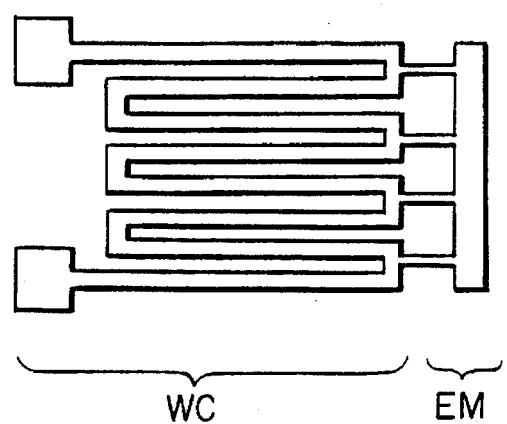
FIGS. 25A, 25B and 25C show electrode wirings where there are provided excess metal storing regions for storing a residual wiring metals.
Figure 25B:
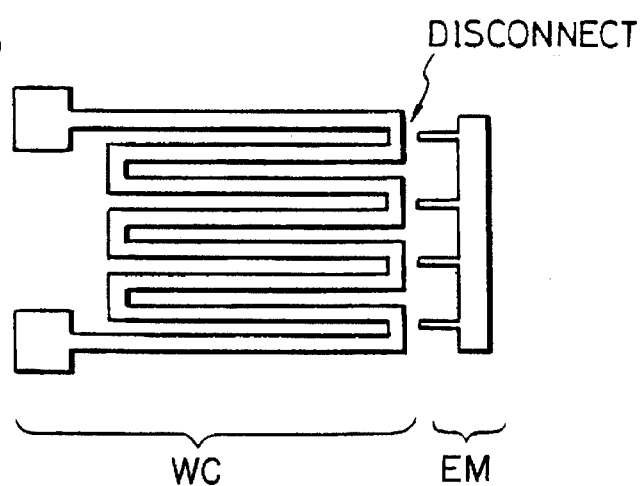

For example, with reference to FIG. 25A and FIG. 25B, in a wire crowded region WC, there may be formed regions EM for storing excess wiring metal which is not to be filled in the groove. In this case, with reference to FIG. 25B, it is necessary to add a process of disconnecting a wiring metal connecting the wiring region and the excess metal storing region. Alternatively, with reference to FIG. 25B, the excess metal storing region EM may be formed in a manner that it circumvents the wiring pattern.

Figure 25C:
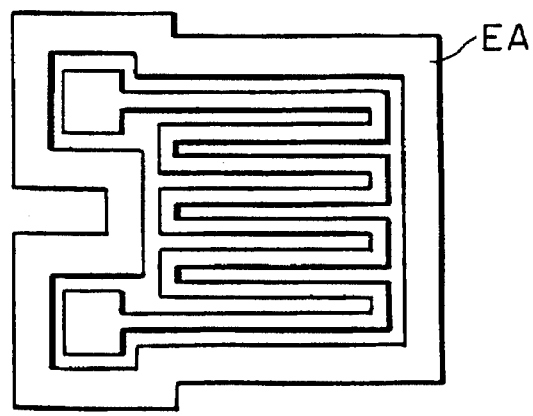

Moreover, the residual metal may be arranged to be collected in an external portion of a chip, such as in a dicing line or the like. FIG. 25C contains an excess Al storing region EA.

Figure 26A:
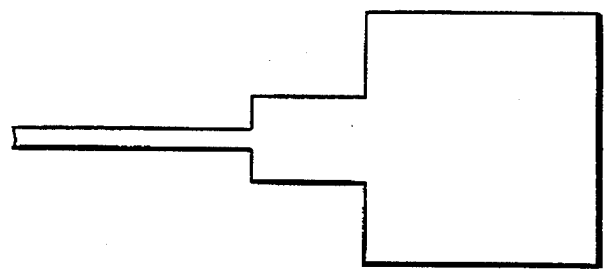
FIG. 26A and 26C show corresponding prior arts thereto respectively.
Figure 26B:
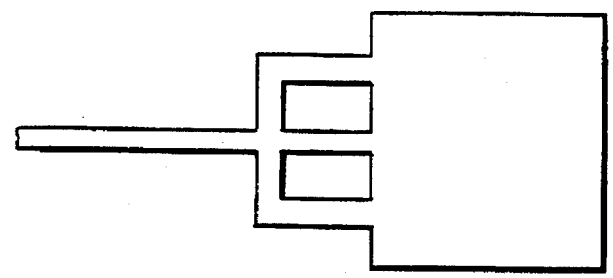
Figure 26C:
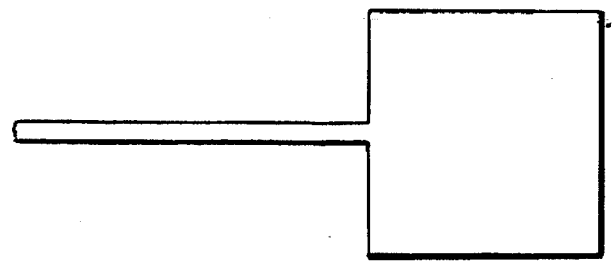
Figure 26D:
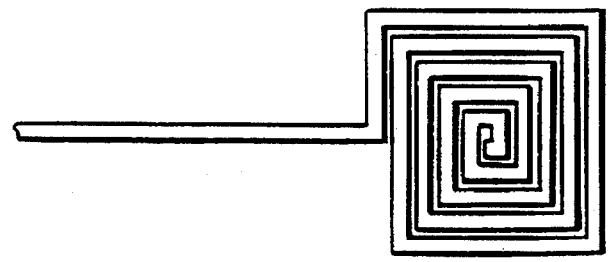

With reference to FIG. 26B and FIG. 26D, in a portion where a groove portion such as a pad portion is wide, the groove portion may be divided into plural parts.

Embodiment No. 6

Figure 27:
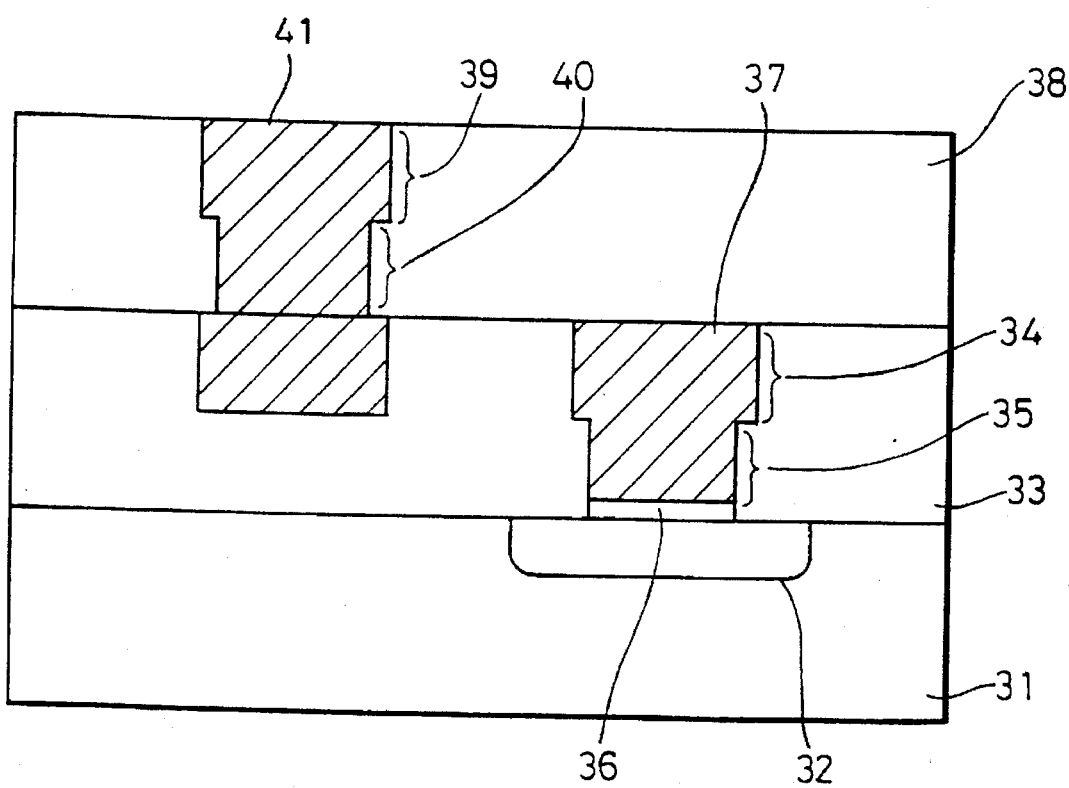
FIG. 27 shows a structure of the electrode wiring according to the sixth embodiment.

FIG. 27 shows a structure of the electrode wiring according to the sixth embodiment. Though not shown in the figure, there is formed an element structure below an interlayer insulator 33.

FIGS. 28A–28E show cross sectional views for forming the electrode wiring structure in the semiconductor device.

Figure 28A:
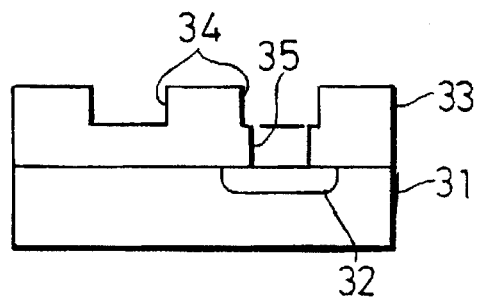
FIGS. 28A–28E show cross sectional views for forming the electrode wiring structure in the semiconductor device.

With reference to FIG. 28A, on a Si (100) single-crystal substrate where an n-type diffusion layer 32 is formed therein, a $SiO_2$ film 33 serving as an interlayer insulator is formed by the CVD. Then, a film thickness of the $SiO_2$ 33 was 1.6 μm. On the surface of the $SiO_2$ film 33, there is formed a groove 34 serving as a first Al wiring where the width and depth thereof are 1.2 μm and 0.8 μm, respectively, by the photo-lithograph and RIE. Thereafter, on the n-type diffusion layer 82, there is formed a contact hole 85 of 1 μm×1 μm by the photolithography and RIE.

A gas utilized in the RIE for forming the groove 34 and the contact hole 85 was a mixture gas of $CF_4$ and $H_2$, each of which is supplied at a flow rate of 18 SCCM and 24 SCCM, respectively. The pressure at the time of etching was controlled at 40 mTorr, and the applied power at the time of etching was 800 W. The residual resist was removed in an atmosphere of oxygen plasma. Thereafter, cleansing was carried out in mixture of sulfuric acid and hydrogen peroxide water.

Figure 28B:
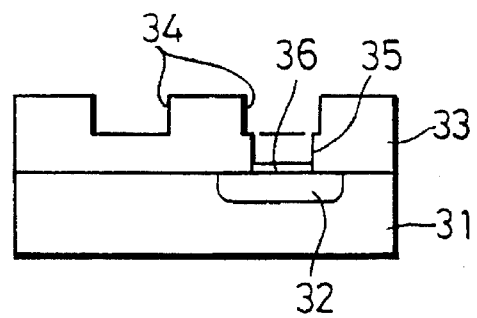

Next, with reference to FIG. 28B, there is selectively formed a deposition layer 88 serving as a barrier metal, on the bottom of the contact hole 85. Then, the barrier metal was selectively formed on the only bottom face of the contact hole 85. However, the barrier metal may be formed over the whole surface of the interlayer insulator including the wiring groove 84 and the contact hole 35. In this case, the barrier metal formed in the area excluding the inner surface of the groove and contact hole may be removed before the Al is formed, or the metal may be removed together in a later stage of the process of removing the Al.

Figure 31:
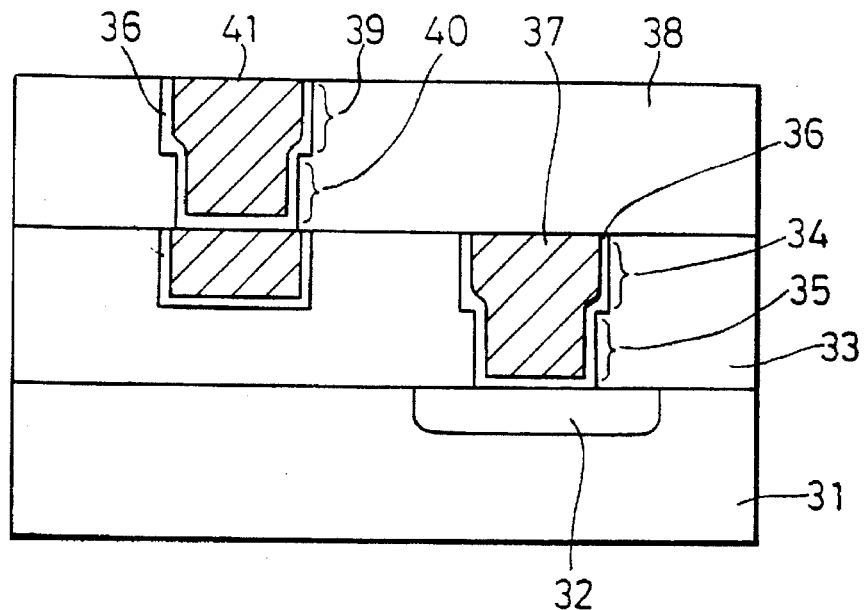
FIG. 31 shows an example of the electrode wiring structure where the barrier metal is formed through the inner surface of the groove.

FIG. 31 shows a device structure where the barrier metal is left in the inner surface of the groove and the contact hole. The material of the barrier metal is such that reaction with the Si substrate is suppressed. On the Si substrate, the Al thin film 37 with a thickness of 0.4 μm was formed by the d.c. magnetron sputtering without annealing.

Then, the Al with purity 99.9999% was used for a sputtering target. Ar was a gas that was utilized in the sputtering, the background pressure was less than $10^{-a}$ Torr, the pressure under sputtering was $3\times10^{-3}$ Torr, and the applied power was 6 KW.

Figure 28C:
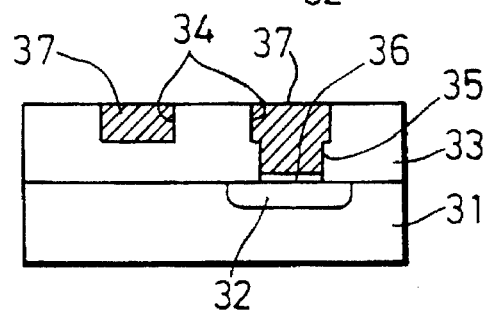

With reference to FIG. 28C, the above device is thermal-processed under the same vacuum background as in the sputtering for duration of one minute, so that the Al thin film 37 is filled into the groove 34 by agglomeration so as to form a first layer Al wiring 37. Thereafter, the Al remained in the wide range region where the wiring pattern is not formed was removed using a polishing technique. The same was applied to the upper surface of the Al wiring 37 as in the polishing condition.

Figure 28D:
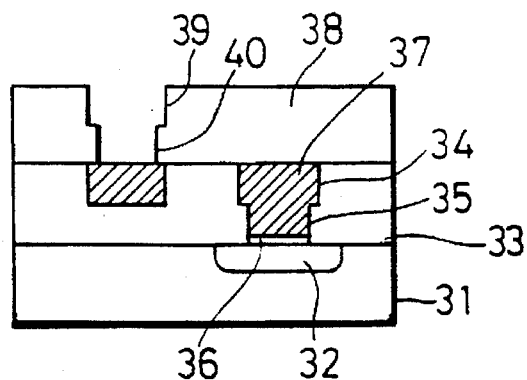

Next, with reference to FIG. 28D, there is formed a $SiO_2$ film 88 serving as the interlayer insulator, by a plasma CVD method. Then, the substrate was heated at 450° C. and the thickness of $SiO_2$ film was 1.8 μm. On the surface of the $SiO_2$ film 38, there is formed a groove 39 serving as a second layer Al wiring where the width and depth thereof are 1.2 μm and 0.8 μm, respectively, by the photo-lithography and RIE. Thereafter, there is opened a via hole 40 of 1 μm×1 μm on the first layer Al wiring 37, by the optical lithography and RIE. Then, the condition under the RIE was similar to the case in forming the groove 34 and the contact hole 35 shown in FIG. 28A.

Figure 28E:
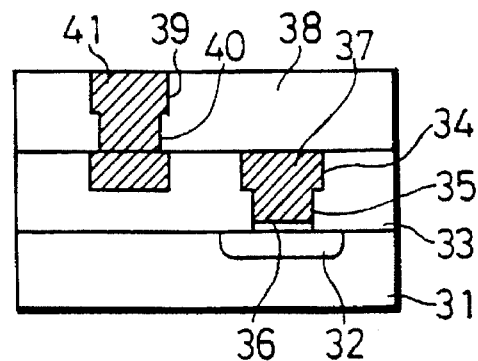

With reference to FIG. 28E, the second layer Al wiring 41 was formed under the same condition in which the first layer Al wiring 37 was formed.

When the Al thin film is agglomerated on the substrate having the above wiring grooves by means of annealing under a melting point thereof, the Al is filled into the groove while the Al is nearly in melting state. That the Al thin film becomes nearly the melting state under the melting point accounts for that the rate at which the Al atom having a great diffusion tendency at surface or grain boundary occupies in the Al thin film is significantly increased. In other words, the atoms in the surface and boundary surface of the thin film have more unbonded hands than in ones inside the film.

Therefore, the atoms at the surface or grain boundary of the film can be easily diffused with a small amount of energy. Thus, when a rate at which the number of atoms at the surface or grain boundary occupies among the total number of atoms is significantly increased, the film can be reached to a melting state by a less thermal energy, so that the process can be achieved at a lower temperature. Moreover, if the native oxide film is suppressed from being formed on the wiring metal surface, the surface atoms will be further easy to move, will tend to reach the melting state at a further lower temperature, and can prevent impurities such as oxygen which disturbs the crystal orientation from mixing thereinto.

Figure 29:
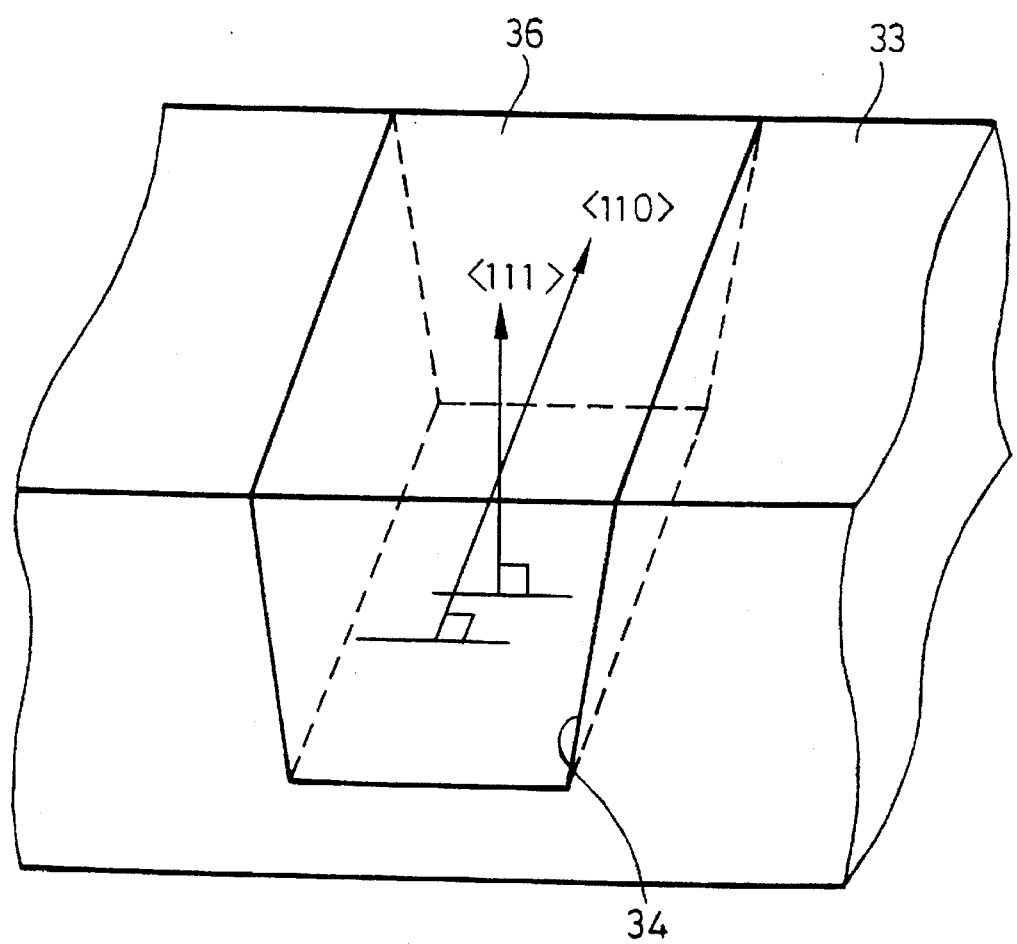
FIG. 29 shows an example of the crystal orientation of the single-crystal Al in the groove.

The Al which was filled into the groove under the melting state was crystal-oriented from the groove surface so as to form a single crystal in a unit of mm. FIG. 29 shows an example of the crystal orientation of the single-crystal Al in the groove. In FIG. 29, there is formed a (111) Al surface in parallel to the base face and side face of the groove, there is indicated a <110> orientation in a lateral direction of the groove. The Al (111) surface is a re-densified surface and is a crystalline surface which has a minimum surface energy.

Therefore, as a result of that the Al is recrystallized in order that the atoms of Al can be most stable in terms of the surface energy, the crystalline orientation shown in FIG. 29 results. Moreover, when the contact hole is also filled simultaneously with the groove, the crystalline orientation thereof follows the Al in the groove. This is because the area of the contact hole's inner surface is much smaller than that of the groove's inner surface. Therefore, the wiring and a plug therefor can be made out of the same single-crystal.

Figure 30:
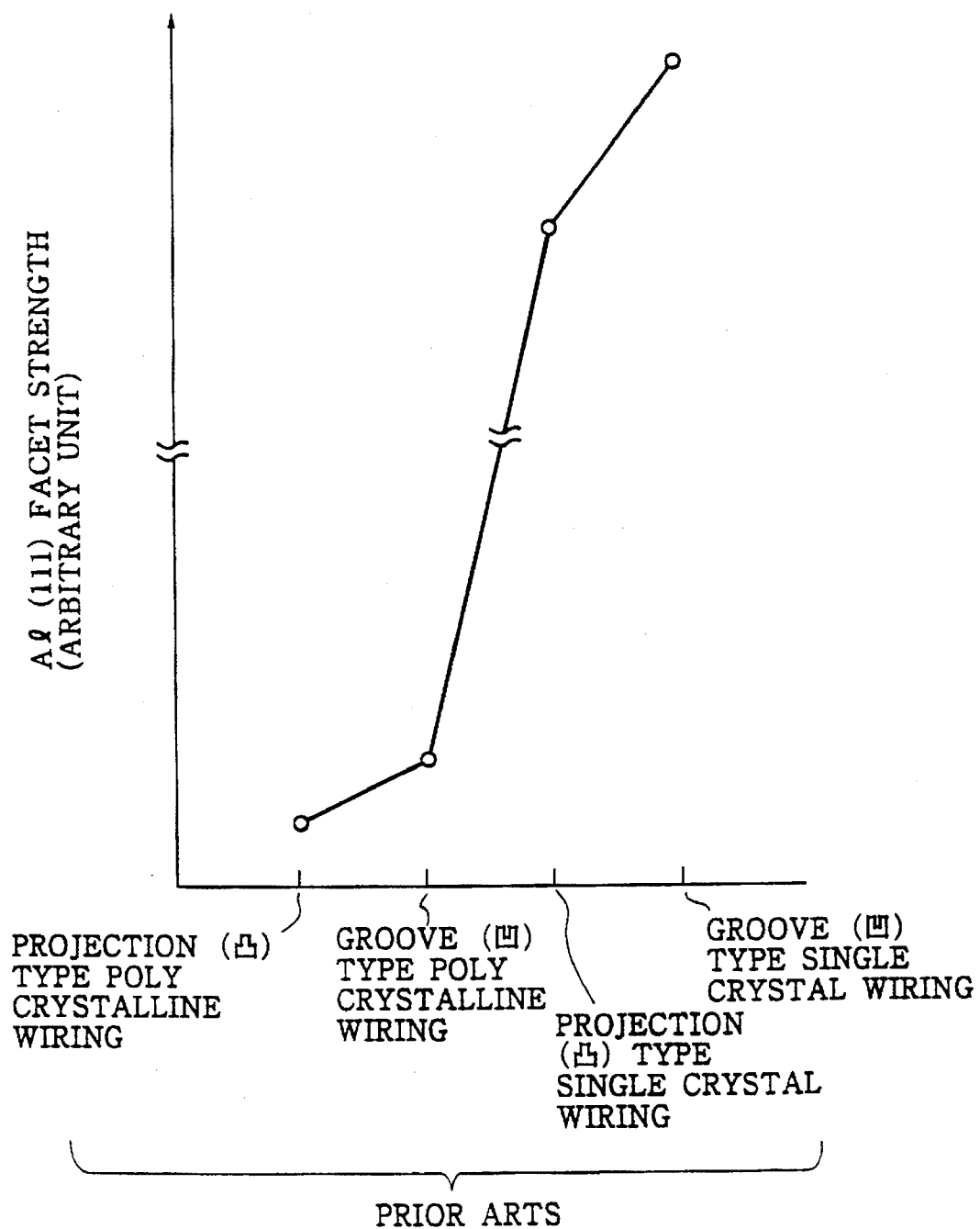
FIG. 30 shows a result of change in crystallization of the Al wiring due to a mechanical stress of the interlayer insulating film.

FIG. 30 shows a result of difference in crystallization of the Al wiring due to a mechanical stress of the interlayer insulating film observed by the X-ray diffraction technique. In the same figure, the vertical axis thereof indicates an X-ray intensity, so that the greater the intensity becomes the better the crystallization thereof is. Compared to a projection type structure which is etching-processed, in the groove type structure where the wiring metal is filled into the groove of the interlayer insulator, the wiring metal is already covered with both the bottom face and side face of the groove, so that the stress generated at a later stage of thermal processing can be scattered into three faces and there does not remain the mechanical stress inside the wiring. In other words, the groove type is far superior to the projection type in crystallization.

The single-crystal wiring which is filled into the groove of the interlayer insulator as shown in FIG. 30 is such that crystallization thereof does not deteriorate due to the mechanical stress, and it is learned that such single-crystal wiring indicates the best crystallization compared to the conventional wiring structure. The fact that there is almost no crystal defects in the wiring structure according to the fifth embodiment was confirmed by the applicant through TEM.

The evaluation result for the Al wiring with 1.2 μm width in terms of reliability therefor was similar to the one shown in FIG. 8. The evaluation test was such that the acceleration test was carried out under the condition where the current density is $1.5 \times 10^7 A/cm^2$ and the substrate temperature is 200° C. As a result thereof, the conventional wiring was disconnected after approximately 60 seconds so that the wire resistance was increased, whereas the wiring formed by the sixth embodiment was not disconnected until 9000 seconds.

When the wiring is such that the average grain size is 2–3 μm as in the conventional practice, the current density guaranteeing 10 FIT at 100° C. can not exceed $10^6 A/cm^2$. In contrast thereto, the wiring formed thus in the sixth embodiment can guarantee 10 FIT for the current density exceeding $10^6 A/cm^2$.

Though there has been described in the sixth embodiment the electrode structure where the barrier metal is formed only in the base face of the contact hole. However, the structure therefor may be such that the barrier metal 36 is formed through the inner surface of the groove.

Embodiment No. 7

Figure 32:
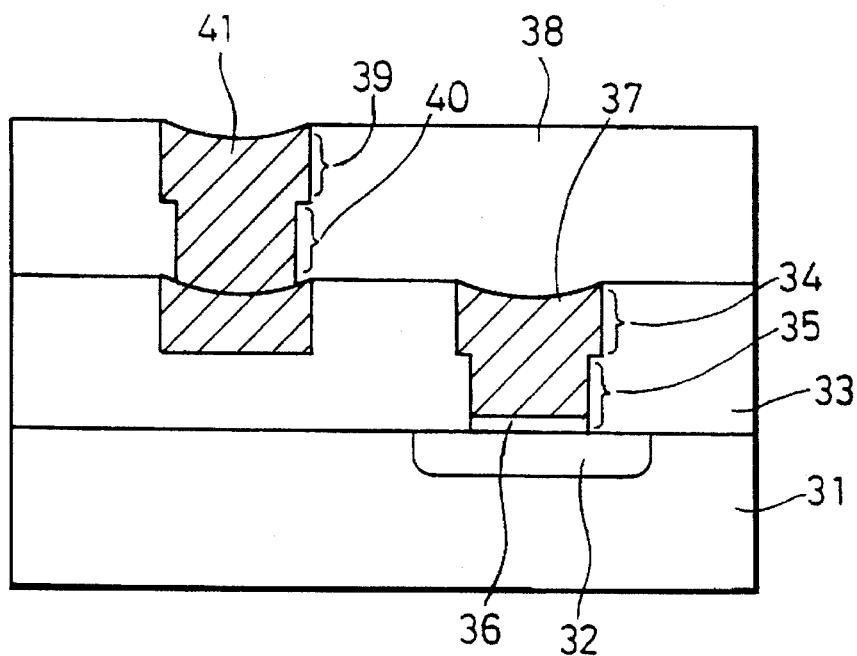
FIG. 32 shows a cross sectional view of the electrode wiring structure according to the seventh embodiment.

FIG. 32 shows a cross sectional view of the electrode wiring structure according to the seventh embodiment.

Though omitted in FIG. 32, there is formed the element structure below the interlayer insulator.

Though the electrode wiring structure as shown in FIG. 32 is formed in the same manner with the sixth embodiment, there remains a curved surface on the upper surface of Al wiring, so that there is used a stopper layer in the polishing process in order to remove the Al remaining in the flat portion. The stopper layer is formed over the whole surface after the Al filling is completed. Then, a C (carbon) film is used as the stopper layer, and a cerium oxide is used for the polishing grains.

In this polishing grains, a polishing rate of the C film is 1/20–1/30 against the $SiO_2$ film, so that the C film can be used as the stopper layer. Though there is formed the C film even on the residual Al at outset of the polishing, the polishing rate is great (fast) enough since a pressure of polishing cloth is concentrated on a projected area.

After the polishing was completed at the stopper layer, a small amount of residual Al was removed by a wet etching. It is to be noted that the C film used as the stopper layer can be removed with ease by subjecting it to the $O_2$ plasma.

Figure 33A:
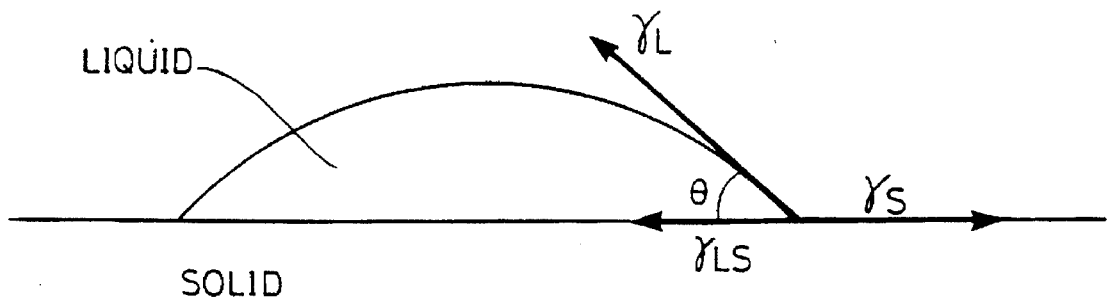
FIGS. 33A–33C show the smoothly curved surface of the upper surface of wiring formed according to the wettability between the Al and the interlayer insulator.

The smoothly curved surface on the upper surface of the wiring is formed due to the wettability between The Al which is in a melting state and the interlayer insulator. With reference to FIG. 33A, the liquid placed on the solid presents generally an orbicular shape where three tensions are balanced to one another. Namely, the liquid contacts with the solid having a contact angle of θ when the surface tension γL of the liquid, the surface tension γs, and the interfacial tension γLS between a solid/liquid boundary are balanced. The same thing can be applied to the Al which is filled into the groove at a melting state.

Figure 33B:
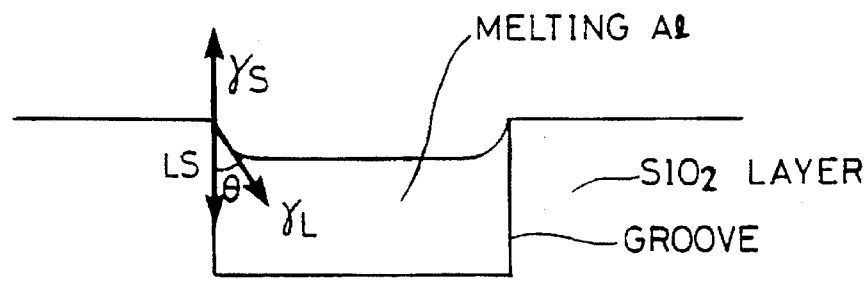
Figure 33C:
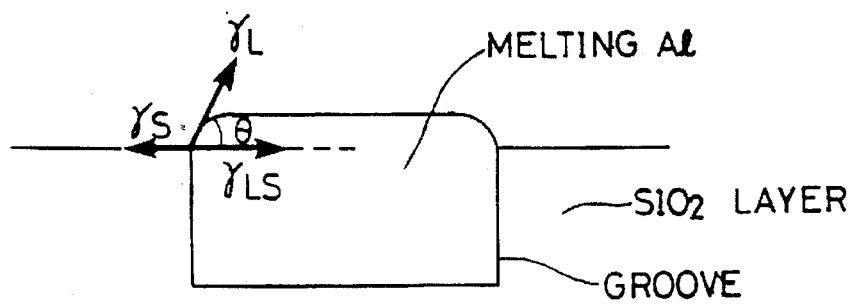

Namely, with reference to FIG. 33B and FIG. 33C, the melted Al contacts with a side wall of the groove in such a manner that there is caused the contact angle therebetween. In the experiment carried out by the applicants, the contact angle between the Al and $SiO_2$ was 55°±15°. Therefore, the upper surface of the Al wiring filled in the groove forms the smoothly curved surface due to the wettability therebetween.

By interconnecting the smoothly curved single-crystal Al wiring from the upper surface, the upper wiring and the plug, the contact area formed accordingly is increased, so that reduction of the contact resistance was duly confirmed.

Moreover, there is increased the contact area between the smoothly curved single-crystal Al wiring from the upper surface Al wiring and the interlayer insulator, and it was confirmed that a radiating efficiency in which the heat generated in the wiring is radiated toward the interlayer insulater is significantly improved.

Though there was shown the wiring structure where the upper surface is smoothly curved downward in FIG. 33B. With reference to FIG. 33C, the same significant effect as in FIG. 33B is obtained for a wiring structure where the upper surface is smoothly curved upward.

Embodiment No. 8

Figure 34:
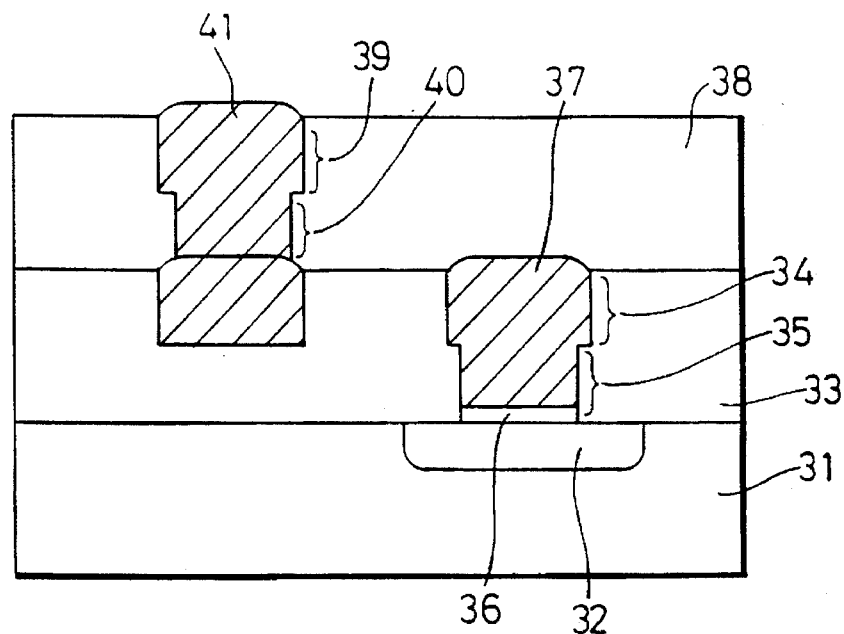
FIG. 34 shows the smoothly curved surface of the upper surface of wring downwardly according to the seventh embodiment.
Figure 35:
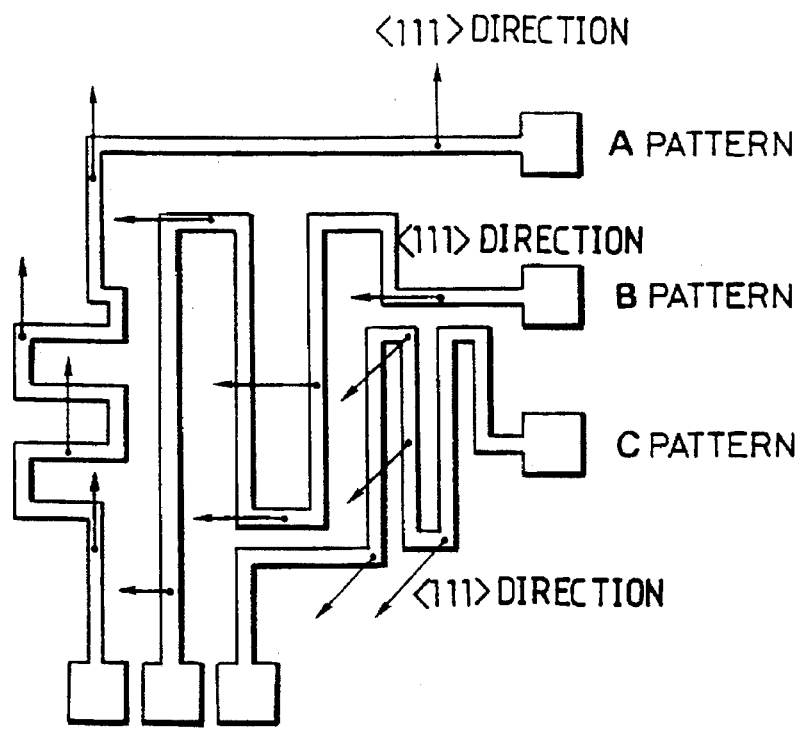
FIG. 35 shows an electrode wiring structure according to the eighth embodiment.
Figure 36A:
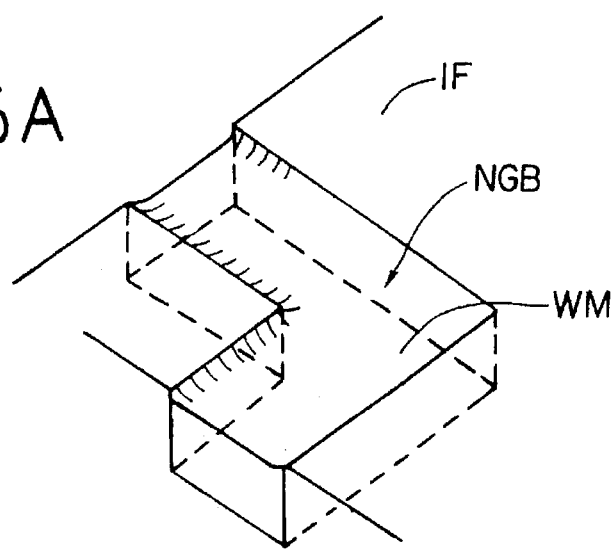
FIGS. 36A–36C show electrode wiring structure according to the ninth embodiment.
Figure 36B:
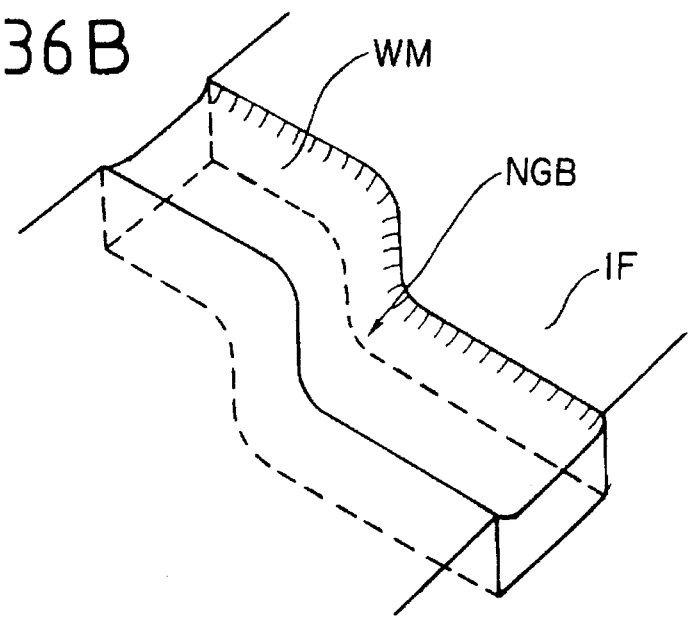
Figure 36C:
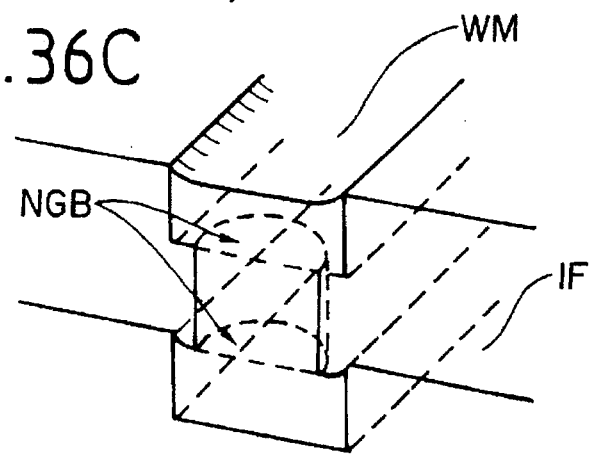

FIG. 35 shows an electrode wiring structure according to the eighth embodiment The electrode wiring structure shown in FIG. 34 is formed by the method where the Al is filled into the groove of the interlayer insulator with annealing as described in the sixth as well as seventh embodiments.

When a plurality of grooves thus formed are not connected in the same layer, namely, when the Al wirings are not connected in the same layer as in pattern A, pattern B and pattern C shown in FIG. 35, it was confirmed by the TEM evaluation that each pattern shows different crystalline orientation. The crystalline orientations for such wiring patterns can be controlled at a desired direction.

In FIG. 35, there is shown an example for crystal orientation in each wiring pattern. In this example, the wiring is formed such that the crystal orientation differs against the substrate where there are a plurality of wiring patterns thereon. The structure of this wiring pattern is not possible by the conventional single-crystal formation method where an epitaxial growth is made from a single-crystal substrate.

In the single crystal, a thermal expansion coefficient differs for different crystal orientations. The thermal expansion is a phenomenon such that a bonding distance between atoms is changed by a thermal energy. The configuration of the atom differs at each crystal face, so that the distance which is expanded in each oriented direction differs.

In case where the orientation differs for each wiring pattern as shown in FIG. 35, the wirings do not expand in one direction alone, so that the direction of stress applied to the substrate can be dispersed to different directions. When the stress of the substrate is reduced, defects of the semiconductor device due to the stress can be reduced. Accordingly, when the crystalline orientation of the wiring in each pattern is changed, reduction of the stress on the substrate was confirmed by measuring warp of the substrate.

Embodiment No. 9

FIGS. 38A–86C show electrode wiring structure according to the ninth embodiment. The ninth embodiment is characterized in that there is no crystal grain boundary NGB in a connecting portion of the upper and lower layers or a bending portion. These electrode wiring structures are such that the Al, the wiring metal WM, is filled into the groove of the interlayer insulator film IF by annealing as described in the sixth and seventh embodiments.

In the conventional wiring structures, the mechanical stress is concentrated on the bending portions so that it is not possible to avoid the formation of the crystal grain boundary. In contrast thereto, the method in which the Al is filled into the groove of the interlayer insulator film IF realizes that the stress is dispersed as described in the sixth and eighth embodiments Consequently, there is realized the electrode wiring structure by which the crystal grain boundaries do not occur in the bending portion or wiring connecting portion.

That the crystal grain boundaries do not result in the bending portion or the wire connecting portion was duly confirmed by the TEM evaluation.

Figure 37:
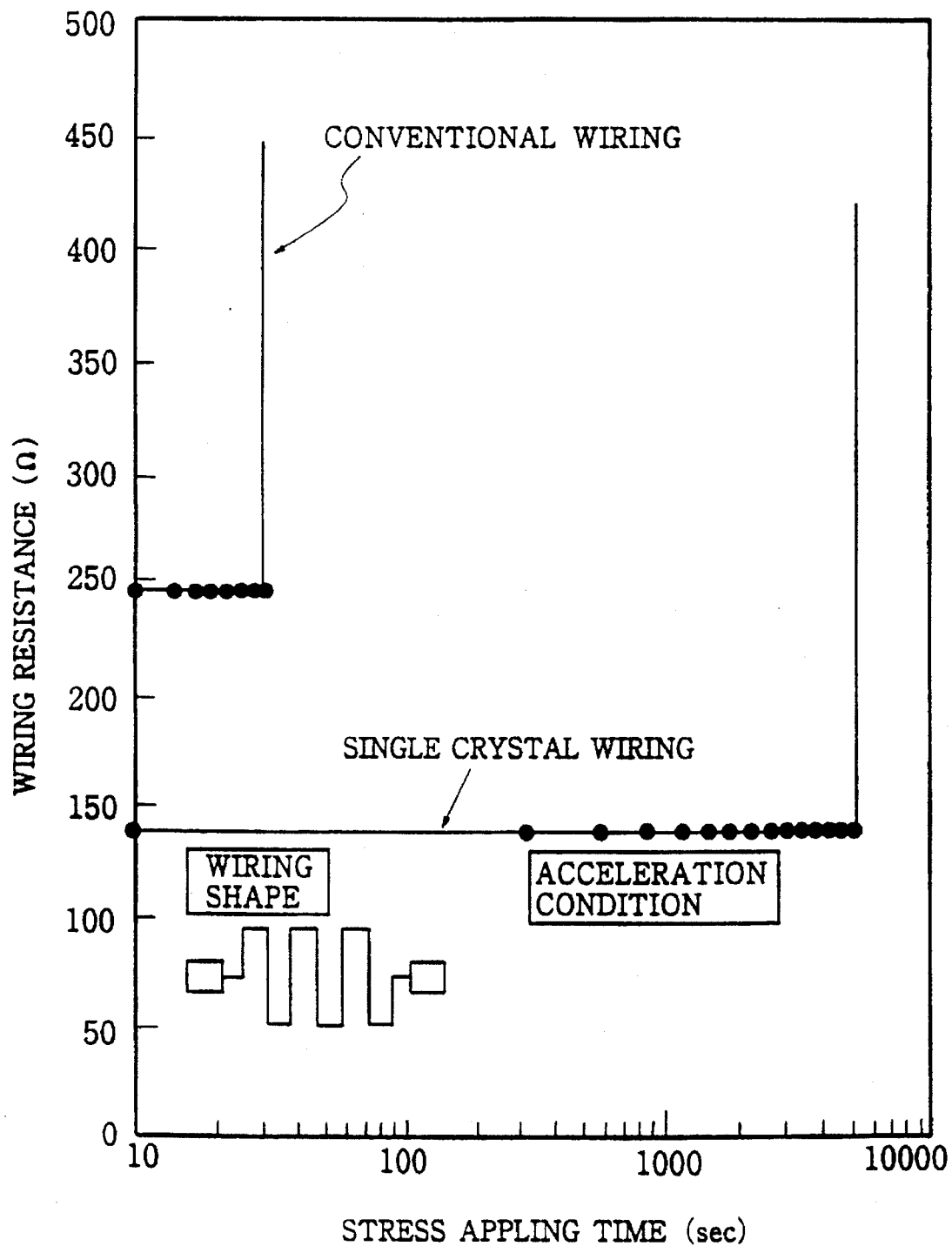
FIG. 37 shows an evaluation result on the reliability of the Al wiring whose width is 1.2 μm and the bending portion according to the ninth embodiment.

FIG. 37 shows an evaluation result on the reliability of the Al wiring with the bending portion according to the ninth embodiment, whose width is 1.2 μm, length is 1440 μm, and thickness is 0.4 μm. The current density was $1.5 \times 10^\tau$ A/cm$^2$ and the acceleration test was carried out at the substrate temperature of 200° C. in the evaluation. As a result thereof, the wiring according to the ninth embodiment was not disconnected until 6000 seconds.

In the conventional case where there are crystal grain boundaries in the bending portion, the current density that guarantees 10 FIT at 100° C. can not exceed $10^6$ A/cm$^2$. In contrast thereto, it was confirmed that 10 FIT is guaranteed for the current density exceeding $10^6$ A/cm$^2$, in the ninth embodiment.

Embodiment No. 10

Figure 38:
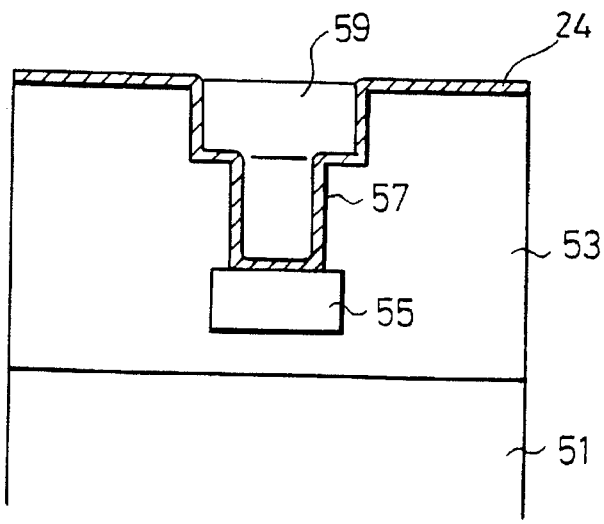
FIG. 38 shows an electrode wiring structure according to the tenth embodiment.

FIG. 38 shows an electrode wiring structure according to the tenth embodiment. The tenth embodiment is characterized in that there is provided a wettability improving layer in the inner surface of the groove and that the filled-in metal wiring is a single crystal. In the electrode wiring structure, the C film 24 is used for the wettability improving layer, and the Al was filled into the groove by annealing to realize a single-crystallization. In FIG. 38, the reference numeral S1 denotes a Si substrate, 55 a W electrode, 53 an interlayer insulator, 57 a contact hole, 59 a single-crystal Al wiring and 24 the C film.

Though the W 55 is used for a conductor which is connected through the Al wiring and the contact hole 57 in the tenth embodiment, the W can be connected to other metal and may be directly connected to the Si substrate 51.

As described in the fifth embodiment, the C film 24 is a material having a preferable wettability with the Al. Having a good wettability means that there exists good adhesiveness therebetween. Therefore, the two materials would not peel off on account of the stress applied from the interlayer insulator and so on and a thermal stress applied at a later state of processing.

A cross sectional observation showed that the peeling of the single-crystal Al wiring tends to be further reduced by providing the C film 24.

Moreover, the C film is reluctant to diffuse and react with W, Al, Si, and so on. Thereafter, there is obtained a significant effect of suppressing the diffusion and reaction between W and Al, and Al and Si, respectively, so that the C film can be utilized as a barrier layer.

Figure 39A:
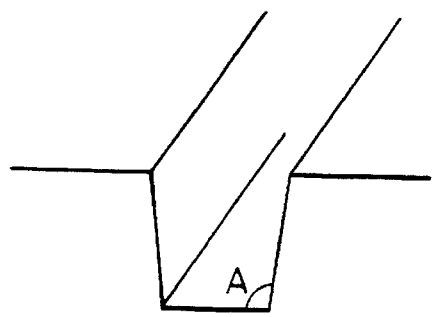
FIGS. 39A and 39B shows an example showing an angle made by the base face and the side face of the groove and an angle of bend of the wiring.
Figure 39B:
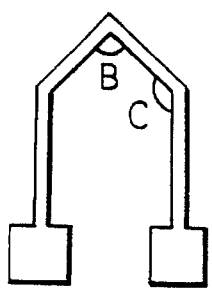

In the above first through tenth embodiments, there is preferred a groove structure whereby the ratio of (a boundary area where the Al contacts with the interlayer insulator, the wettability improving layer or the barrier layer)/(the area of the upper surface of Al) is relatively great and the step coverage is excellent. With reference to FIG. 39A and 39B, it is preferred that an angle A made by the bottom face and the side face of the groove or angles of bend B, C of the wiring are processed in a manner that those angles are equal to the angles of crystal facet. For instance, there are shown angles made between the crystal surfaces of cubic crystals in FIG. 40 and FIG. 41.

Figure 42A:
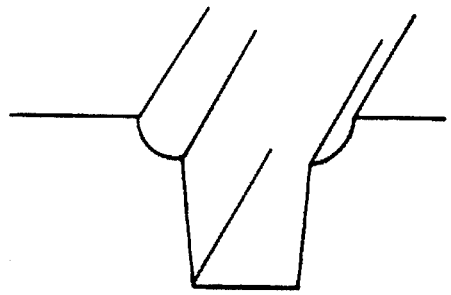
FIGS. 42A–42C show examples of groove shapes in order to improve the step coverage.
Figure 42B:
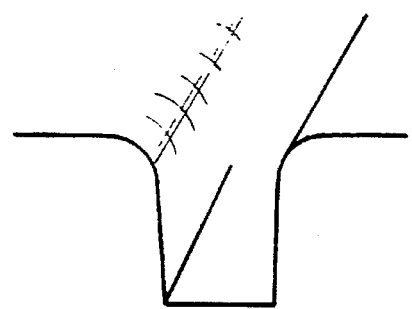
Figure 42C:
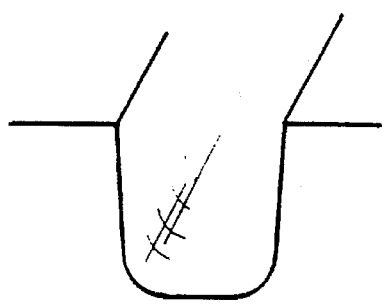

Moreover, in order to improve the step coverage at the time of Al film formation by sputtering, groove shapes such as in FIG. 42A–42C may serve the purpose and be implemented to the first through tenth embodiments.

In the first through tenth embodiments, when the wiring regions are relatively wide as in a pad portion so that filling is difficult and the single crystallization is not possible, the wide regions may be divided into a plurality of narrow grooves as shown in FIG. 28B and FIG. 26D.

Though Al was used as the wiring metal in the course of describing the first through ten embodiments, other metals such as Al alloy, Cu, Ag, Au, Pt and so on can be used as well.

Figure 43A:
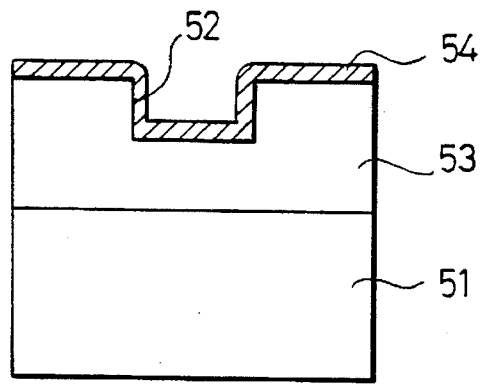
FIGS. 43A–43C show electrode wiring structures where there are provided barrier layers.
Figure 43B:
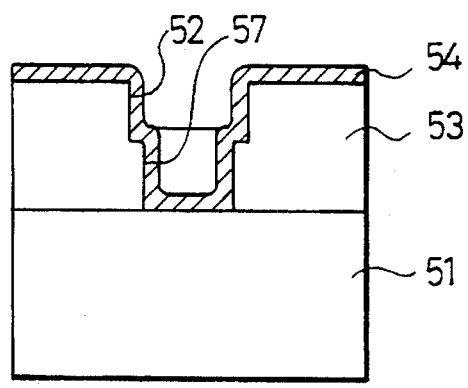
Figure 43C:
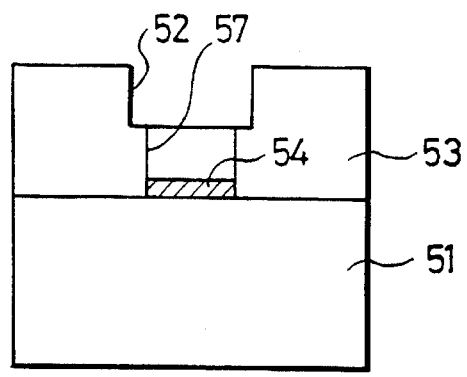

Though SiO$_2$ or BPSG is used as the insulator in the first through ten embodiments, there may be formed a barrier layer 54 in order that the reaction between the wiring metal film and the substrate insulator or Si substrate 51 is suppressed and the diffusion of metal constituting the wiring metal film into the substrate side is suppressed, as shown in FIG. 43. In FIG. 43, the reference numeral 51 denotes the Si substrate, 53 the insulator, 52 a groove for wiring and 54 the barrier layer.

The material which suppresses the reaction with the wiring metal film such as Al, Al alloy, Cu, Ag, Au, Pt and which suppresses diffusion of the constituent metal for these wiring metal films may be C, refractory metal nitride such as TiN, ZrN, HfN, TaN, VN, NbN, or refractory metal boride such as $TiB_2$, $ZrB_2$, $HfB_2$, VB, TaB, NbB, or refractory metal carbide such as TiC, ZrC, HfC, Tac, VC, NbC, or metal oxide such as $IrO_3$, $In_2O$, $RuO_2$, RhO and so on.

In addition thereto, there may be TiW for Al and Al alloy, and there may be Cr, Mo, W, V, Nb, Ta and so on for Cu, Ag, Au, Pt. In case where the direct electrical contact with the Si substrate is not necessary, there may be used insulators such as MgO, $Al_2O_3$ and so on for Al.

Figure 44A:
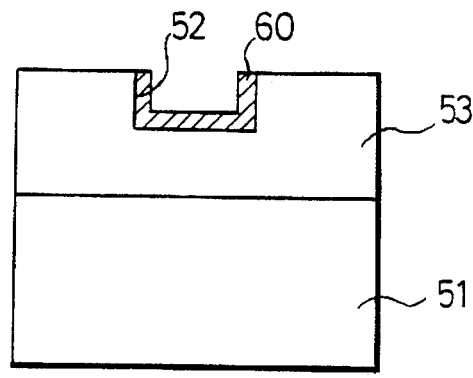
FIGS. 44A–44C show an electrode wiring structure where the wettability improving layer is formed in the inner surface of the groove.
Figure 44B:
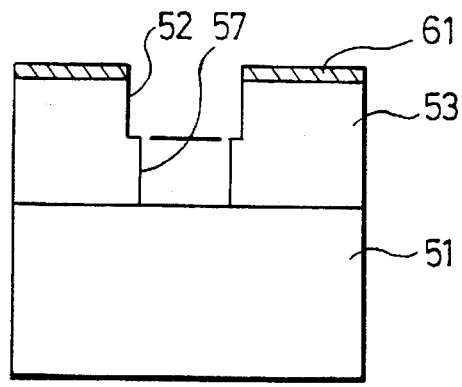
Figure 44C:
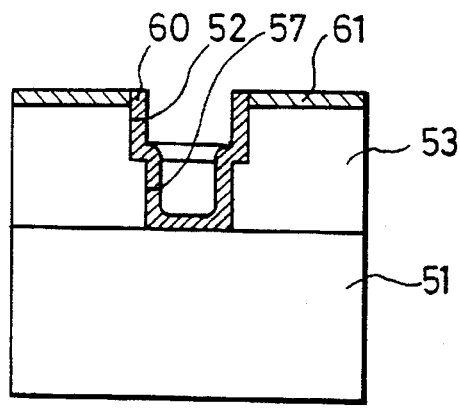

Moreover, though $SiO_2$ or BPSG is utilized as an insulator in the first through fourth embodiments and the sixth through ninth embodiments, a wettability improving layer 60 may be formed in the inner surface of the groove in order to improve the wettability between a wiring metal film and a substrate material as shown in FIGS. 44A–44C. In the same figures, the reference numeral S1 denotes a Si substrate, 53 an insulator, 52 the wiring groove and 80 the wettability improving layer.

As the material which improves the wettability with the wiring metals such as Al, Al alloy, Cu, Ag, Au, Pt, there are C, refractory metal nitride such as TiN, ZrNm HfN, TaN, VN, NbN, or refractory metal boride such as $TiB_2$, $ZrB_2$, $HfB_2$, VB, TaB, NbB, or refractory metal carbide such as TiC, ZrC, HfC, TaG, VC, NbC, or metal oxide such as$IrO_3$, $In_2O$, $RuO_2$, RhO and so on. In addition thereto, there are TiW, MgO, $Al_2O_3$ for the Al and Al alloy, and there are Cr, Mo, W, V, Nb, Ta and so on for Cu, Ag, Au and Pt.

Conversely, there may be employed an structure where there is used a material which relatively deteriorates the wettability as a wettability deteriorating layer compared to the inner surface of the groove and which is formed in other region than the inner surface of the groove. As the wettability deteriorating material, there are considered one constituted by light elements such as F, H, O and so on. Moreover, the wettability improving layer and the wettability deteriorating layer may be used to serve as the barrier layer as well, and when there is necessity of direct electrical contact thereto, a conductor may be used therefor.

Moreover, in case where a conductive layer is exposed in the inner surface of the groove, the wettability improving layer may be formed on the substrate surface excluding the groove portion. This technique will be described in detail as follows.

First, there are formed a deposition layer of W 70 and TiN 72 as a lower electrode, on which there is formed a $SiO_2$ film 38 of 1.2 μm thickness by a plasma CVD method. Thereafter, the contact hole 35a was formed by the photolithography and RIE in a manner that there remains the $SiO_2$ film with 0.4 μm. After a resist 74 was removed, the C film 24 serving as the wettability improving layer was formed at 0.02 μm by the d.c. magnetron sputtering technique.

Figure 45A:
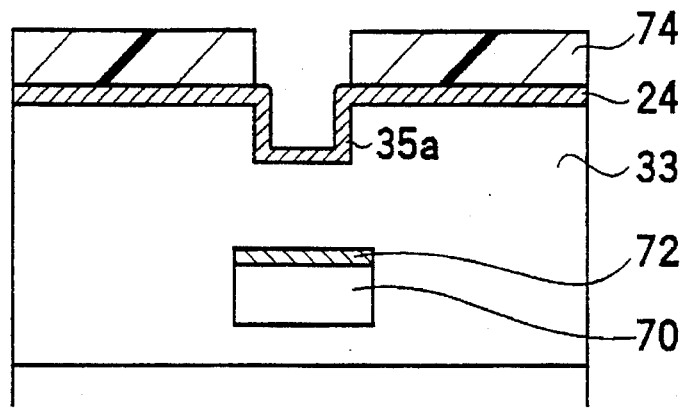
FIGS. 45A–45C show an electrode wiring structure where there is formed the wettability improving layer in the area other than the groove portion.

Thereafter, there is formed a resist on the C film 24, and the patterning is performed on the resist in a manner that the wiring groove pattern is fit into the contact hole 35a which is etched half way using the photolithography again, as shown in FIG. 45A. Next, the etching is perforated on the C film 24 by the RIE using the oxygen ($O_2$), and the etching is carried out on the $SiO_2$ film 38 by as much as 0.4 μm by RIE using the mixture gas of $CF_4$ and $H_2$ continuously. By this etching, the surface of TiN which is an upper layer of the lower electrode is exposed on the bottom face of the contact hole 35b.

Figure 45B:
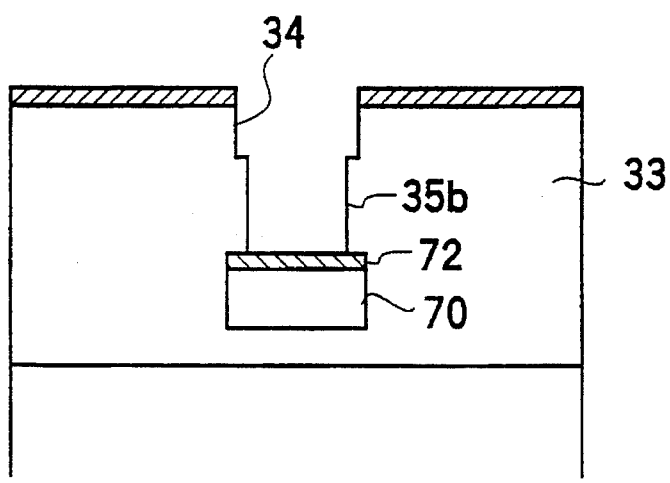

Thereafter, with reference to FIG. 45B, the resist is removed by a down-flow etching with $CF_4$ and $O_2$ gases. Next, a pure Al film 19 is formed at 0.2 μm by the d.c. magnetron sputtering technique. Thereafter, the substrate is heated at 550° C. for 45 seconds without being exposed to the air and the Al film 19 is filled into the groove including the contact hole 35 by annealing as shown in FIG. 45C.

Figure 45C:
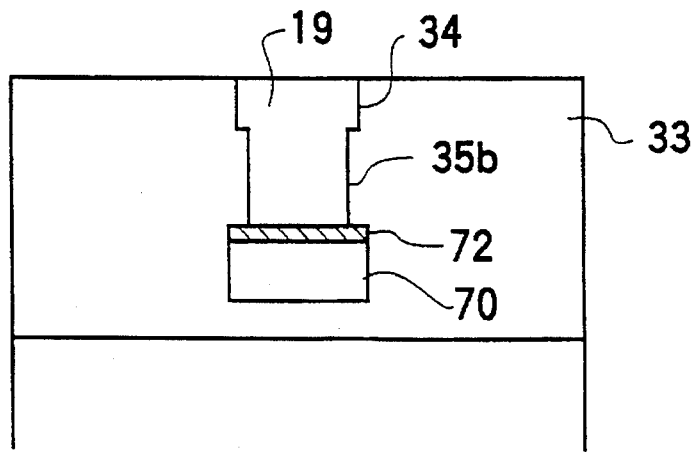

Moreover, the residual island-shaped Al remaining in the flat C film 24 excluding the groove was removed using a polishing technique After the polishing is completed, the C film 24 which is the wettability improving layer as well as serves as the stopper layer is removed by the plasma process as shown in FIG. 45C.

Then, the $SiO_2$ film of the groove's side wall has a contact angle of 55 with respect to the Al, which is less than the fill-in critical angle described in the fifth embodiment. Therefore, filling Al in the groove makes the surface energy thereof small so as to be stabilized. The contact angle between the Al and the C film 24 (with 0.02 μm thickness) in other region than the groove is approximately 17°, so that a probability where an agglomerated Al body is contacted with the groove is higher than a probability where there is formed a groove in $SiO_2$. Therefore, the film thickness of the Al thin film can be suppressed to a minimum to the degree that the Al fills out the volume of the groove.

Moreover, by implementing the tenth embodiment, even when an insulator is used as the wettability improving layer, an electrical contact between the lower-layer electrode and the Al is not disturbed.

In summary, by employing the method for producing the semiconductor device according to the present invention, the metal pattern can be formed with ease, and a process for a material in which the wiring pattern is formed by the etching is reduced, so that there is caused no problem of corrosion due to the etching gas.

Moreover, by employing the method for producing the semiconductor device according to the present invention, the wiring metal which is filled in the groove is formed with a uniform crystalline orientation. Moreover, it is possible to form the metal thin film based on the metal which is filled into the groove and has a uniform crystallization as a crystalline seed, so as to obtain a large-area wiring metal film having the uniform crystallization.

The wiring having the uniform crystalline orientation has excellent endurance against electromigration and stressmigration so as to improve the reliability of the electrode wiring.

Furthermore, by employing the electrode wiring structure according to the present invention, there is obtained the single-crystal structure suppressing the stress, so that the reliability such as the resistance of migrations can be effectively improved.

Besides those already mentioned above, many modifications and variations of the above embodiments may be made without departing from the novel and advantageous features of the present invention. Accordingly, all such modifications and variations are intended to be included within the scope of the appended claims.

What is claimed is:

1. A semiconductor device comprising:
   an insulator in which there is formed a plurality of groove portions, each of which is kept separate one from the other and having a predetermined shape; and
   single-crystal electrode interconnections, filled in the groove portions, each of which differs in crystal orientation thereof.

2. A semiconductor device comprising:
   an insulator in which there is formed a groove portion having a predetermined pattern shape; and an electrode interconnection made of a single-crystal metal which is filled in the groove portion, and a wettability improving layer of polycrystalline or amorphous material is formed between the insulator and the single-crystal metal.

3. A semiconductor device comprising:

a first insulator in which there is formed a groove portion having a predetermined pattern shape;

a second insulator in which there is formed a groove portion having a predetermined pattern shape;

a first electrode interconnection made of a single-crystal metal which is filled in the groove portion in the first insulator; and a second electrode interconnection made of a single-crystal metal which is filled in the groove portion in the second insulator, and the first and second electrode interconnections are connected with a single-crystal metal which has a same crystal orientation as the first and second electrode interconnections.

* * * * *